US012062650B2

(12) United States Patent
Ando

(10) Patent No.: US 12,062,650 B2
(45) Date of Patent: Aug. 13, 2024

(54) VACUUM CHANNEL ELECTRONIC ELEMENT, OPTICAL TRANSMISSION CIRCUIT, AND LAMINATED CHIP

(71) Applicants: Yoshiyuki Ando, Tokyo (JP); Rieko Ando, Tokyo (JP); Yukiko Noguchi, Tokyo (JP); Emiko Takahira, Tokyo (JP)

(72) Inventor: Yoshiyuki Ando, Tokyo (JP)

(73) Assignees: Yoshiyuki Ando, Tokyo (JP); Reiko Ando, Tokyo (JP); Yukiko Noguchi, Tokyo (JP); Emiko Takahira, Tokyo (JP)

( * ) Notice: Subject to any disclaimer, the term of this patent is extended or adjusted under 35 U.S.C. 154(b) by 0 days.

(21) Appl. No.: 18/051,135

(22) Filed: Oct. 31, 2022

(65) Prior Publication Data

US 2023/0154908 A1 May 18, 2023

(30) Foreign Application Priority Data

Nov. 15, 2021 (JP) ................................. 2021-185919

(51) Int. Cl.
*H01L 25/16* (2023.01)
*G02B 6/12* (2006.01)
*H01L 29/76* (2006.01)

(52) U.S. Cl.
CPC ........ *H01L 25/167* (2013.01); *G02B 6/12004* (2013.01); *H01L 29/7606* (2013.01)

(58) Field of Classification Search
CPC . H01L 29/7606; H01L 29/7613; H01L 29/78; H01L 29/768; H01L 29/76808;

(Continued)

(56) References Cited

U.S. PATENT DOCUMENTS 5,203,731 A * 4/1993 Zimmerman ......... H01J 21/105
445/51
5,994,735 A * 11/1999 Maeda ................ H01L 29/7827
257/302

(Continued)

FOREIGN PATENT DOCUMENTS

JP 6818931 B1 1/2021

OTHER PUBLICATIONS

Srisonphan, S., Jung, Y. & Kim, H. Metal-oxide semiconductor field-effect transistor with a vacuum channel. Nature Nanotech 7, 504-508 (2012). <https://doi.org/10.1038/nnano.2012.107>.

(Continued)

*Primary Examiner* — Natalia A Gondarenko
(74) *Attorney, Agent, or Firm* — Fox Rothschild LLP; Carol Thorstad-Forsyth

(57) ABSTRACT

A laminated body is provided in a circumferential shape with a gap formed in a part of a circumferential direction on a semiconductor layer. In the laminated body, a first insulating layer, a gate layer, a second insulating layer, and a drain layer are layered in this order from the semiconductor layer side. An impurity diffusion layer is formed on a surface of the semiconductor layer, and a backside electrode on a backside surface. The impurity diffusion layer extends from a position in contact with side walls in a channel space to an outside of the laminated body through a region corresponding to the gap on the surface of the semiconductor layer. A portion of the impurity diffusion layer beyond the laminated body is a contact region to which a wiring for applying a predetermined voltage is connected. A cover layer made of an insulating material is formed in an upper portion and a periphery of the annular portion including the laminated body and the gap.

12 Claims, 13 Drawing Sheets

(58) Field of Classification Search
CPC .............. H01L 29/76816; H01L 29/772; H01L 29/7727; H01L 29/7788; H01L 29/7802; H01L 29/7827; H01L 29/783; H01L 29/7835; H01L 29/7889; H01L 29/402; H01L 29/43; H01L 29/66015; H01L 29/785; H01L 29/7851; H01L 29/7857; H01L 29/7858; H01L 29/66439; H01L 29/66795–66818; H01L 27/092; H01L 27/142; H01L 27/14607; H01L 27/14612; H01L 27/14614; H01L 27/14616; H01L 33/041; H01L 33/38; H01L 33/382; H01L 33/387; H01L 31/02024; H01L 31/022475; H01L 31/02322; H01L 31/109; H01L 31/1124; H01L 31/1129; H01L 31/125; H01L 31/14; H01L 31/147; H01L 31/162; H01L 31/02005; H01L 31/02002; H01L 31/02016; H01L 31/0201; H01L 31/02013; H01L 31/0224; H01L 31/0203; H01L 31/12; H01L 31/02325; H01L 31/02327; H01L 31/035281; H01L 31/035236; H01L 31/035209; H01L 31/054; H01L 31/048; H01L 31/107; H01L 31/143; H01L 31/153; H01L 31/167; H01L 31/173; H01L 31/206; H01L 23/02; H01L 23/04; H01L 23/041; H01L 23/043; H01L 23/053; H01L 23/057; H01L 23/3107; H01L 23/495; H01L 23/49524; H01L 23/49531; H01L 23/49541; H01L 23/49838; H01L 33/0025; H01L 33/04; H01L 33/0095; H01L 33/0075; H01L 33/48; H01L 33/483; H01L 33/486; H01L 33/507; H01L 33/60; H01L 33/62; H01L 27/14643–14663; H01L 27/1469; H01L 27/153; H01L 27/156; H01L 25/042; H01L 25/072; H01L 25/073; H01L 25/115; H01L 25/167; G02B 6/12004
USPC .......................................... 257/192, 10, 133
See application file for complete search history.

(56) References Cited

U.S. PATENT DOCUMENTS

| | | | | |
|---|---|---|---|---|
| 6,642,575 | B1* | 11/2003 | Ono | H01L 29/78642 257/302 |
| 8,440,997 | B2* | 5/2013 | Wang | H01L 31/035236 257/E29.245 |
| 9,331,189 | B2 | 5/2016 | Kim et al. | |
| 2005/0104504 | A1* | 5/2005 | Takeuchi | H01J 1/304 313/495 |
| 2011/0169276 | A1* | 7/2011 | Akamatsu | H02N 11/008 74/DIG. 9 |
| 2012/0104487 | A1* | 5/2012 | Ikebuchi | H10B 12/053 257/329 |
| 2014/0353576 | A1* | 12/2014 | Patti | H01J 9/025 257/10 |
| 2017/0092778 | A1* | 3/2017 | Zhang | H01L 29/66666 |
| 2018/0053777 | A1* | 2/2018 | Xiao | H01L 29/66833 |
| 2020/0161494 | A1* | 5/2020 | Fujihara | H01L 23/49513 |
| 2020/0284727 | A1* | 9/2020 | Sagmeister | G01N 21/643 |

OTHER PUBLICATIONS

Kohani Khoshkbijari, F., Sharifi, M.J. Reducing the gate current in vacuum channel field-emission transistors using a finger gate. J Comput Electron 19, 263-270 (2020). <https://doi.org/10.1007/s10825-020-01448-y>.

Kim, Myungji and Hong Koo Kim. "Ultraviolet-enhanced photodetection in a graphene/SiO2/Si capacitor structure with a vacuum channel." Journal of Applied Physics 118 (2015): 104504.

* cited by examiner

VACUUM CHANNEL ELECTRONIC ELEMENT, OPTICAL TRANSMISSION CIRCUIT, AND LAMINATED CHIP

CROSS REFERENCE TO RELATED APPLICATIONS

This application claims the benefit of foreign priority to Japanese Patent Application No. 2021-185919, filed on Nov. 15, 2021, which is incorporated by reference in its entirety.

BACKGROUND OF THE INVENTION

1. Technical Field

The present invention relates to a vacuum channel electronic element, an optical transmission circuit, and a laminated chip.

2. Description of the Related Art

As a vacuum channel electronic element using vacuum as a medium of charge carriers, for example, a vacuum channel field effect transistor suitable for high-speed operation is known (see, for example, Siwapon Srisonphan, Yun Suk Jung, and Hong Koo Kim, "Metal-oxide-semiconductor field-effect transistor with a vacuum channel", NATURE NANOTECHNOLOGY, VOL 7, AUGUST 2012; Fatemeh Kohani Khoshkbijari, and Mohammad Javad Sharifi, "Reducing the gate current in vacuum channel field-emission transistors using a finger gate", Journal of Computational Electronics (2020) 19: 263-270; and U.S. Pat. No. 9,331,189).

Srisonphan et al. teach a vacuum channel field effect transistor (FET) including a source electrode formed of a silicon semiconductor substrate, and a silicon oxide, a gate electrode, a silicon oxide, and a drain electrode, which are sequentially formed on the source electrode, wherein charge carriers are emitted into vacuum from side walls of the source electrode. For example, in the case of an n-type vacuum channel field effect transistor, the source electrode is constituted by a p-type silicon, and a current flows between the source and the drain in such manner that electrons of a two-dimensional electron system (2 DES) and an inversion layer induced in the vicinity of an interface between a source layer and the silicon oxide on the source layer by a gate voltage and a source-drain voltage are emitted into the vacuum from an end surface of the source electrode at a voltage lower than an FN tunneling due to a Coulomb repulsive force between the electrons, and reach the drain electrode. U.S. Pat. No. 9,331,189 also describes the vacuum channel field effect transistor having a similar configuration.

Khoshkbijari et al. teach a vacuum channel field effect transistor including an anode electrode (a drain), and a silicon oxide, a gate electrode, a silicon oxide, and a cathode electrode (a source), which are sequentially formed on the anode electrode, in which the electrons are emitted into a vacuum from end surfaces of the cathode electrode. The electrons are emitted from the side walls of the cathode electrode into the vacuum through the FN tunneling caused by a gate voltage and a cathode-anode voltage.

Further, a photodetector using a vacuum channel is known. For example, as described by Myungji Kim and Hong Koo Kim, "Ultraviolet-enhanced photodetection in a graphene/SiO$_2$/Si capacitor structure with a vacuum channel", Journal of Applied Physics 118, 104504 (2015), a photodetector has a laminated structure in which an insulating layer formed of a graphene and a silicon oxide and an n-type or a p-type silicon layer are laminated. When light is incident on the silicon layer in a state where a reverse bias is applied between the graphene and the silicon layer, carriers (electrons) drift to the interface between the silicon layer and the insulating layer to form 2 DEG, and are emitted from end surfaces of the silicon layer into a space and captured by the graphene. Accordingly, a current flows between the graphene and the silicon layer. U.S. Pat. No. 9,331,189 also describes a photodetector having a similar configuration.

Further, a field emission display array using a vacuum channel is described in U.S. Pat. No. 9,331,189. This field emission display array has a structure including a first conductive layer that is transparent and made of a p-type or n-type silicon, a phosphor layer provided on a bottom surface of the first conductive layer, a second conductive layer, and an insulating layer that is provided between the phosphor layer and the second conductive layer. When a predetermined voltage between the first conductive layer and the second conductive layer is applied, the electrons accumulated at the interface between the insulating layer and the second conductive layer are emitted into the space and are incident on the phosphor layer, causing the phosphor layer to emit light.

JP 6818931 B describes the vacuum channel field effect transistor provided with an impurity diffusion layer in order to increase a source-drain current. In this vacuum channel field effect transistor, a first insulating layer, a gate electrode, a second insulating layer, and a drain electrode are layered on the semiconductor substrate, and the impurity diffusion layer is formed on a surface of the semiconductor substrate that is a bottom portion in the space surrounded by the first insulating layer, the gate electrode, the second insulating layer, and the drain electrode.

SUMMARY OF THE INVENTION

In the vacuum channel field effect transistor of U.S. Pat. No. 9,331,189, since a source power supply is a backside surface of a substrate with respect to the interface between an insulating film and the substrate serving as the source, a substrate resistance between the interface and the backside surface is added to an on-resistance of the transistor, and characteristics of the transistor are deteriorated, which leads to that a wiring connecting the power supply and the interface serving as the source is required and a structure capable of easily connecting the source to the wiring is desired.

The present invention has been made in view of the above circumstances, and an object thereof is to provide a vacuum channel electronic element having a structure that is easy to manufacture, an optical transmission circuit using the same, and a laminated chip.

A vacuum channel electronic element according to the present invention includes: a semiconductor layer; a laminated body wherein a first insulating layer that is insulating and formed on the semiconductor layer, a gate layer that is conductive and formed on the first insulating layer, a second insulating layer that is insulating and formed on the gate layer, and a drain layer that is conductive and formed on the second insulating layer are included, and wherein first side walls are exposed in a space defined by wall surfaces including the first side walls formed to include an end surface of the first insulating layer, an end surface of the gate layer, and an end surface of the second insulating layer; and a conductive layer that is conductive, provided on a surface of the semiconductor layer, in contact with the first side walls in the space, and has a lower resistivity than that of the semiconductor layer extending beyond the laminated body from the space through a non-forming region where the laminated body is not formed; wherein charge carriers in an induced inversion or accumulation layer of the semiconductor layer move into the conductive layer and travel to the drain layer in the space due to applying a predetermined voltage to the semiconductor layer, the conductive layer, the gate layer, and the drain layer.

A vacuum channel electronic element according to the present invention includes: a semiconductor layer; a first laminated body wherein the first insulating layer that is insulating and formed on the semiconductor layer, a gate layer that is conductive and formed on the first insulating layer, and a second insulating layer that is insulating and formed on the gate layer are included, and wherein first side walls are exposed in a space defined by wall surfaces including the first side walls formed to include an end surface of the first insulating layer, an end surface of the gate layer, and an end surface of the second insulating layer; a second laminated body wherein a third insulating layer that is insulating and formed on the semiconductor layer and a drain layer that is conductive and formed on the third insulating layer are included, the wall surfaces include second side walls formed to include an end surface of the third insulating layer and an end surface of the drain layer, and the second side walls are exposed in the space; and a conductive layer that is conductive, provided on the surface of the semiconductor layer, in contact with the first side walls in the space, and has the lower resistivity than that of the semiconductor layer extending from the space beyond the first laminated body via a region other than the first laminated body and the second laminated body; wherein charge carriers in an induced inversion or accumulation layer of the semiconductor layer move into the conductive layer and travel to the drain layer in the space due to applying a predetermined voltage to the semiconductor layer, the conductive layer, the gate layer, and the drain layer.

A vacuum channel electronic element according to the present invention includes: a base layer that is insulating; a laminated body wherein a base insulating layer that is insulating and on the base layer, a semiconductor layer formed on the base insulating layer, a first insulating layer that is insulating and formed on the semiconductor layer, a gate layer that is conductive and formed on the first insulating layer, and a second insulating layer that is insulating and formed on the gate layer are included, and wherein first side walls formed to include an end surface of the base insulating layer, an end surface of the semiconductor layer, an end surface of the first insulating layer, and an end surface of the gate layer are exposed in a space; and a drain layer that is conductive and provided on the base layer with a surface exposed to the space; wherein the position is separated from an interface between the semiconductor layer and the base insulating layer toward a side of the base layer side; wherein charge carriers in an induced inversion or accumulation layer of the semiconductor layer move to the drain layer in the space due to applying a predetermined voltage to the semiconductor layer, the gate layer and the drain layer.

A vacuum channel electronic element according to the present invention includes: a semiconductor layer, a laminated body wherein a first insulating layer that is insulating and formed on the semiconductor layer, a gate layer that is conductive and formed on the first insulating layer, and a second insulating layer that is insulating and formed on the gate layer are included, and wherein first side walls are exposed in a space defined by wall surfaces including the first side walls formed to include an end surface of the semiconductor layer, an end surface of the first insulating layer, the end surface of the gate layer, and an end surface of the second insulating layer; and a drain layer formed on the second insulating layer; wherein a light is incident on an interface between the first insulating layer and the semiconductor layer, a voltage is applied between the semiconductor layer and the gate layer such that a depletion layer is formed on the surface of the semiconductor layer, and charge carriers caused by a light incident on the surface of the semiconductor layer move to the drain layer due to applying a predetermined voltage between the semiconductor layer and the drain layer.

In an optical transmission circuit of the present invention, the vacuum channel electronic element described above provided as a light emitting element, the vacuum channel electronic element described above provided as a light receiving element, and a waveguide that guides the light from the light emitting element to the light receiving element are provided on the same substrate.

The laminated chip of the present invention is a laminated chip wherein a first chip and a second chip are laminated, the first chip includes the vacuum channel electronic element described above provided as a light emitting element and outputs the light from the light emitting element in a laminating direction of the first chip and the second chip, and the second chip includes a light receiving element that receives the light from the light emitting element.

According to the present invention, since the conductive layer that is conductive and has the lower resistivity than that of the semiconductor layer has a configuration in which the conductive layer extends beyond the laminated body from the space defined by the side walls of the laminated body through the non-forming region where the laminated body is not formed, the wiring from the power supply can be easily connected to the conductive layer.

DETAILED DESCRIPTION

First Embodiment

Figure 1:
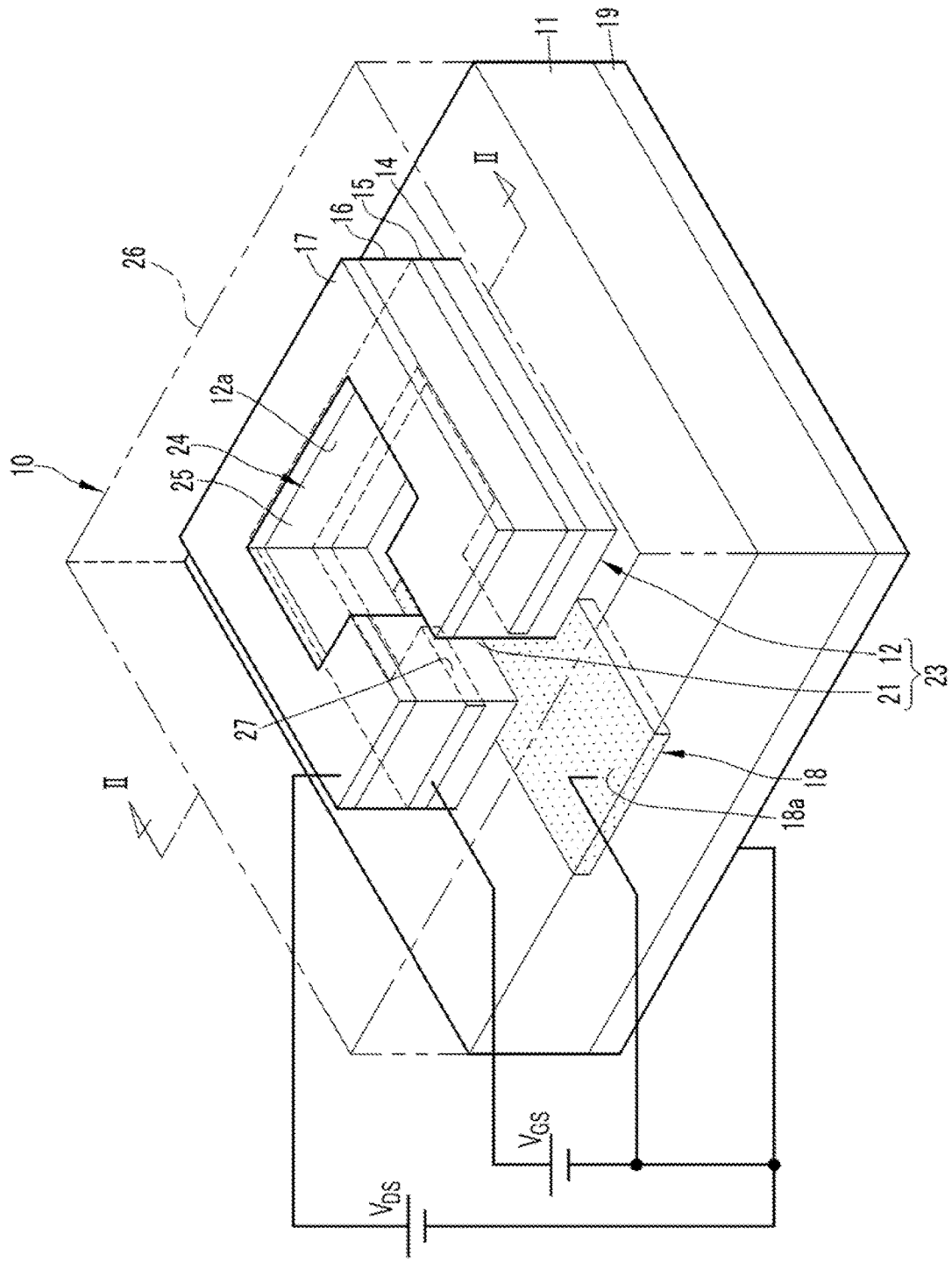
FIG. 1 is a perspective view illustrating an FET according to a first embodiment.
Figure 2:
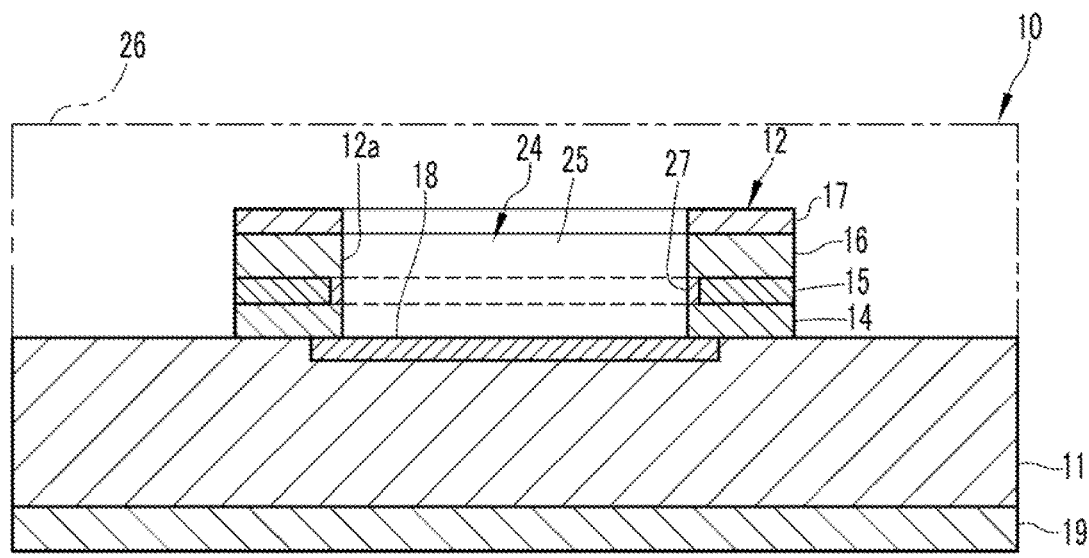
FIG. 2 is a cross-sectional view illustrating a cross section of the FET along a line II-II in FIG. 1.

FIG. 1 illustrates a vacuum channel field effect transistor (hereinafter, referred to as an FET) 10 as a vacuum channel electronic element in a first embodiment. Further, FIG. 2 illustrates a cross section of the FET 10 along a line II-II in FIG. 1. The FET 10 in this example is an n-type field effect transistor, and a laminated body 12 is formed on a p-type semiconductor layer 11. In the laminated body 12, a first insulating layer 14 that is insulating, a gate layer 15 that is conductive and serves as a gate electrode, a second insulating layer 16 that is insulating, and a drain layer 17 that is conductive and serves as a drain electrode are layered in this order from the semiconductor layer 11 side, and a thickness of each layer is substantially constant. In addition, an impurity diffusion layer 18 is formed on the surface of the semiconductor layer 11, and a backside electrode 19 is formed on the backside surface. The semiconductor layer 11, the impurity diffusion layer 18, and the backside electrode 19 serve as a source electrodes of the FET 10.

Further, in the following description, as illustrated in FIG. 1, the upper direction and the lower direction are defined with a surface side of the semiconductor layer 11 on which the laminated body 12 is provided as an upper side and a surface side of the semiconductor layer 11 on which the backside electrode 19 is provided as a lower side, but a vertical direction does not limit the attitude and the direction in which the FET 10 is used.

The semiconductor layer 11 is, for example, a silicon substrate, and the p-type semiconductor layer is used in this example. Additionally, as long as an inversion layer or an accumulation layer is formed as described later, the semiconductor layer 11 may be made of a single crystal silicon or a polycrystalline silicon (a polysilicon), or may be made of another semiconductor other than the silicon, such as GaAs or GaN.

The laminated body 12 has a shape provided with a gap 21 obtained by cutting out a part of a quadrangular cylindrical shape extending in the upper direction from the semiconductor layer 11 in the vertical direction, and is provided in a circumferential shape in which the gap 21 is formed in a part of a circumferential direction. The space defined by side walls 12a of the laminated body 12 constitutes a space (hereinafter, referred to as a channel space) 24 serving as a channel through which charge carriers (electrons in this example) are emitted and move. More specifically, a space 25 surrounded by an annular portion 23 including the laminated body 12 and the gap 21 and the gap 21 that is a space sandwiched by the side walls 12a facing each other at a predetermined interval constitute the channel space 24. Additionally, after the impurity diffusion layer 18 is formed, the gap 21 may be filled with an insulating material such as a silicon oxide ($SiO_2$), and merely the space 25 may be used as the channel space 24.

A cover layer 26 covers the periphery and the upper portion of the annular portion 23. Accordingly, the upper surface of the channel space 24 and the opening of the gap 21 are closed by the cover layer 26 to form a closed space. The cover layer 26 is made of an insulating material (for example, a silicon oxide ($SiO_2$)). Further, the channel space 24 may be an open space partially connected to the outside. The definition of the channel space 24 is not strict and may be such that the channel space 24 is defined, for example, as a space between a pair of opposing wall surfaces.

The opening size in the cross section orthogonal to the vertical direction of the space 25 constituting the channel space 24 has a rectangular shape in which a length of one side is, for example, equal to or larger than 0.05 μm and equal to or smaller than 0.5 μm. Additionally, a cross-sectional shape orthogonal to the vertical direction of the space 25 is not limited to the rectangular shape, and may be a polygon, a circle, an ellipse, a star, or the like.

The side walls 12a as the first side walls are formed to include all the end surfaces of the first insulating layer 14, the gate layer 15, and the second insulating layer 16 on the channel space 24 side, and is exposed to the channel space 24. In this example, the side walls 12a also include the end surface of the drain layer 17 on the channel space 24 side. Further, an insulating film 27 covering the end surface of the gate layer 15 on the channel space 24 side is formed. Accordingly, the end surfaces of the first insulating layer 14 and the second insulating layer 16 and the insulating film 27 as the end surface of the gate layer 15 are exposed to the channel space 24. The insulating film 27 stops the end surface of the gate layer 15 from being exposed to the channel space 24, thereby suppressing the charge carriers emitted to the channel space 24 from being captured by the gate layer 15 and flowing as a leakage current. As a result, a drain-source current can be increased.

Additionally, the first insulating layer 14, the second insulating layer 16, the cover layer 26, and the insulating film 27 are conceptual, and in a case where they are made of the same insulating material, the boundaries between them may not be confirmed.

The first insulating layer 14 and the second insulating layer 16 are formed of the insulating material, for example, the silicon oxide ($SiO_2$). When the semiconductor layer 11 is the silicon substrate, the first insulating layer 14 can be the silicon oxide obtained by oxidizing the surface thereof. Further, the first insulating layer 14 can also be formed as the silicon oxide deposited by a CVD method or the like. The second insulating layer 16 can be formed as the silicon oxide deposited by, for example, the CVD method or the like. The first insulating layer 14 and the second insulating layer 16 may be a silicon nitride or the like.

The thickness of the first insulating layer 14 is, for example, equal to or larger than 2 nm and equal to or smaller than 20 nm, and the thickness of the second insulating layer 16 is, for example, equal to or larger than 10 nm and equal to or smaller than 30 nm. The first insulating layer 14 and the second insulating layer 16 are not required to have the same thickness, and the first insulating layer 14 is preferably formed to be thinner than the second insulating layer 16. In this case, for example, the thickness of the first insulating layer 14 may be equal to or larger than 2 nm and equal to or smaller than 10 nm, and the thickness of the second insulating layer 16 may be equal to or larger than 15 nm and equal to or smaller than 30 nm. The FET 10 has a channel length corresponding to the height from the surface of the semiconductor layer 11 to the lower surface of the drain layer 17, that is, a sum of the thicknesses of the first insulating layer 14, the gate layer 15, and the second insulating layer 16. Since a mean free path of the electrons in air is about 60 nm, when the channel space 24 is air, the height from the surface of the semiconductor layer 11 to the lower surface of the drain layer 17 is desirably equal to or smaller than 60 nm. Since the mean free path of the electrons increases as a vacuum degree increases, for example, when the second insulating layer 16 is thickened to increase a drain breakdown voltage, the vacuum degree of the channel space 24 may be increased according to the film thickness.

The gate layer 15 is formed of a conductive material such as a metal or the polysilicon doped with impurity. The thickness of the gate layer 15 is equal to or larger than 10 nm and equal to or smaller than 20 nm, for example. The insulating film 27 can be formed, for example, by thermally oxidizing the end surface of the gate layer 15 made of the polysilicon. Further, the insulating film 27 may be formed by the CVD method or a sputtering method. The insulating film 27 has a thickness equal to or larger than 1 nm and equal to or smaller than 10 nm, for example. Additionally, the end surface of the gate layer 15 may be directly exposed to the channel space 24.

The impurity diffusion layer 18 is formed as a conductive layer having the lower resistivity than that of the semiconductor layer 11. In this example, the impurity diffusion layer 18 is formed by doping an n-type impurity (for example, As (arsenic) or P (phosphorus)) at a high concentration into the semiconductor layer 11 which is a p-type silicon substrate. The impurity diffusion layer 18 suppresses a fluctuation of a potential difference between a substantial source that emits the charge carriers and GND due to a change in a drain current. In addition, the impurity diffusion layer 18 has a function of increasing the source-drain current by increasing the emission amount of the charge carriers into the channel space 24 as compared with a case where the impurity diffusion layer is not provided.

The impurity diffusion layer 18 is provided on the surface of the semiconductor layer 11 so as to be in contact with the side walls 12a, that is, the end surface of the first insulating layer 14 in the channel space 24, and is provided to extend from a position in contact with the side walls 12a to the outside of the laminated body 12 through a region corresponding to the gap 21. In other words, the impurity diffusion layer 18 extends from the inside of the channel space 24 to an outer peripheral region of the laminated body 12 beyond the laminated body 12 through the non-forming region where the laminated body 12 is not formed. Regions 18a of the impurity diffusion layer 18 beyond the laminated body 12 are used as contact regions to which the wiring for applying the predetermined voltage is connected. In this example, as illustrated in FIG. 2, the impurity diffusion layer 18 is provided so as to be in contact with an edge of the side walls 12a (the first insulating layer 14). Additionally, the impurity diffusion layer 18 may extend to the lower side of the first insulating layer 14.

Figure 3:
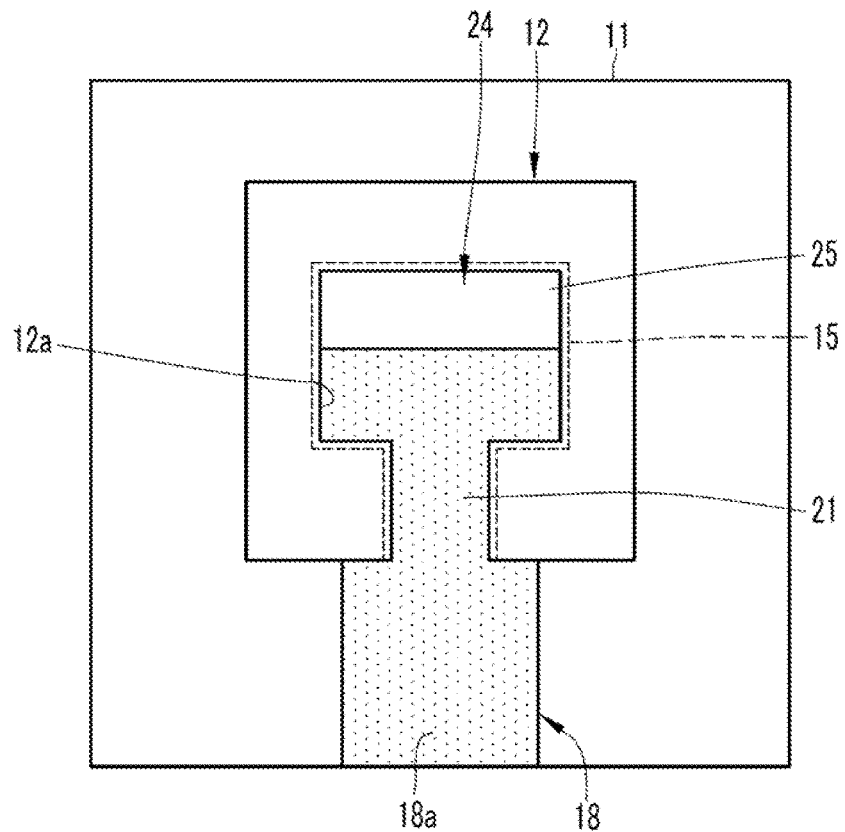
FIG. 3 is a plan view of an FET illustrating a forming region of an impurity diffusion layer on a semiconductor layer.

As illustrated in FIG. 3, in this example, an end portion of the impurity diffusion layer 18 on the channel space 24 side is in the space 25 and on the surface of the semiconductor layer 11, and extends from a position in contact with the side walls 12a exposed to the space 25 to the outer peripheral region of the laminated body 12 through a region corresponding to the gap 21.

The drain layer 17 is formed of a conductive material such as the metal like Al (aluminum) or the polysilicon doped with impurity, and has the thickness, for example, equal to or larger than 50 nm and equal to or smaller than 200 nm. The backside electrode 19 is made of the metal such as Al or a conducting layer such as the impurity diffusion layer, and has the thickness equal to or larger than 50 nm and equal to or smaller than 200 nm, for example. Additionally, when a diffusion layer of the same type as the semiconductor layer 11 for applying the voltage to the semiconductor layer 11, in this example, a p-type diffusion layer is separately provided on the surface of the semiconductor layer 11, the backside electrode 19 can be omitted.

When the p-type silicon substrate is used as the semiconductor layer 11, the FET 10 can be manufactured in the following procedure. Additionally, the procedure described below is an example, and the manufacturing method for the FET 10 is not limited thereto.

First, the silicon oxide is formed as the first insulating layer 14 on the surface of the semiconductor layer 11 which is the p-type silicon substrate by a thermal oxidation method. Subsequently, for example, a phosphorus (P) doped polysilicon layer is formed as the gate layer 15 on the first insulating layer 14 by the CVD method, and the silicon oxide is formed as the second insulating layer 16 on the gate layer 15 by a plasma CVD method.

A photoresist (not illustrated) having an opening in a region other than a region where the laminated body 12 is to be formed is formed on the second insulating layer 16 by a photolithography method. Subsequently, an etching is performed using the photoresist as a mask by a dry etching method to form the laminated body 12 having a predetermined shape. At this stage, the channel space 24 including the gap 21 is formed. Thereafter, the photoresist is removed.

The photoresist in which the region for forming the impurity diffusion layer 18 is opened is formed by the photolithography method, and ions are implanted into the semiconductor layer 11 in the opening by an ion implantation method to form the impurity diffusion layer 18. Thereafter, the photoresist is removed. Additionally, the impurity diffusion layer 18 may be formed in a predetermined region by diffusing the doped impurity through a heat treatment.

After the impurity diffusion layer 18 is formed, the exposed end surface of the gate layer 15 is thermally oxidized by the thermal oxidation method to form the insulating film 27. The thermal oxide film formed on the impurity diffusion layer 18 simultaneously with the formation of the insulating film 27 by the thermal oxidation is removed by an anisotropic etching method.

Further, when the gate layer 15 is made of the metal such as a copper or a tungsten, for example, after the impurity diffusion layer 18 is formed, the silicon oxide may be deposited on, for example, an end surface portion of the gate layer 15 by the CVD method to form the insulating film 27. Additionally, also in this case, the silicon oxide deposited on the impurity diffusion layer 18 is removed by, for example, the anisotropic etching method.

Subsequently, for example, the Al (aluminum) film is formed, and then the formed Al film is processed into the shape of the drain layer 17 by the photolithography method and the dry etching method. Further, the Al film as the backside electrode 19 is formed on the backside surface of the semiconductor layer 11 by the sputtering method.

After the formation of the drain layer 17, a filler is deposited to include the inside of the channel space 24. As the filler, for example, an amorphous carbon that volatilizes at a high temperature equal to or lower than a melting point of the drain layer 17 can be used. The filler is deposited by the sputtering method and subsequently brought to the same height as the laminated body 12 by a CMP method.

Subsequently, the silicon oxide to be a part of the cover layer 26 is formed by the CVD method. The silicon oxide other than the upper portion of the annular portion 23 is removed by patterning by the photolithography method and the dry etching method. Subsequently, in an atmosphere containing oxygen, the heat treatment at 400° C. for two hours is performed, for example. Such heat treatment vaporizes and removes the amorphous carbon as the filler. The filler in the channel space 24 is emitted and removed from the gap 21 to the outside. Subsequently, the silicon oxide is formed by the CVD method. As a result, the cover layer 26 is formed on the upper portion and the outer periphery of the annular portion 23, and the channel space 24 is closed.

Since the filler in the channel space 24 can be removed through the gap 21 as described above, the FET 10 having the closed channel space 24 can be easily manufactured. Moreover, the effect that the closed channel space 24 can be easily formed using the gap 21 as described above has a similar one even in a configuration where the impurity diffusion layer 18 is not provided. The channel space 24 may contain air or may be vacuum. Additionally, a gas such as an inert gas may be sealed in the channel space 24. However, the vacuum is more preferable from the viewpoint of avoiding deterioration of the characteristics due to a scattering of the electrons and a decrease in mobility.

The FET 10 can be manufactured as described above. In the case of wiring the impurity diffusion layer 18, for example, the patterning is performed by the photolithography method and the dry etching method to remove a portion of the cover layer 26 above the regions 18a on the outer periphery of the laminated body 12 of the impurity diffusion layer 18, and then the wiring connected to the regions 18a may be formed. Since the impurity diffusion layer 18 extends from the channel space 24 beyond the laminated body 12 through the gap 21, it is possible to easily wire the impurity diffusion layer 18 without destroying the sealability of the channel space 24.

In addition, the channel space 24 may be formed by dry etching using Ga (gallium) ions using a focused ion beam (FIB) device, for example. Further, while it is described that Al to be the drain layer 17 and the backside electrode 19 is formed by the sputtering method, Ga may be deposited by the FIB device, for example, instead of Al. Moreover, an N-well may be formed in the semiconductor layer 11 as necessary.

When the FET 10 is used, the gate-source voltage $V_{GS}$ is applied between the gate layer 15 and the source electrode to turn on the FET in a state where a drain-source voltage $V_{DS}$ is applied between the drain layer 17 and the source electrode. Specifically, the drain-source voltage $V_{DS}$ is applied such that the drain layer 17 has a positive voltage with respect to the impurity diffusion layer 18 and the backside electrode 19, and the gate-source voltage $V_{GS}$ is applied such that the gate layer 15 has a positive voltage with respect to the impurity diffusion layer 18 and the backside electrode 19 serving as the source electrode.

By the application of the gate-source voltage $V_{GS}$, the electrons accumulate on the surface of the semiconductor layer 11 that is the interface with the first insulating layer 14, and the inversion layer is formed. Subsequently, due to the Coulomb repulsive force generated between the electrons in the inversion layer, the barrier of emission of the electrons to the channel space 24 is significantly lowered. Accordingly, the electrons of the inversion layer are emitted from the edge of the surface of the semiconductor layer 11 to the channel space 24. In addition, because the impurity diffusion layer 18 is in contact with the side walls 12a of the impurity diffusion layer 18, the electrons in the inversion layer and the impurity diffusion layer 18 are connected with each other. Therefore, the electrons in the semiconductor layer 11 flow into the impurity diffusion layer 18, and the flown electrons are emitted into the channel space 24. In this manner, the electrons emitted to the channel space 24 are attracted by the electric field generated by the drain-source voltage $V_{DS}$ and move to the drain layer 17. As a result, the FET 10 is turned on by the application of the gate-source voltage $V_{GS}$, and a drain-source current $I_{DS}$ flows.

As described above, since the Coulomb repulsive force between the electrons is used to emit the electrons from the semiconductor layer 11, it is possible to emit the electrons at a low gate-source voltage $V_{GS}$, that is, to turn on the FET 10, as compared with the case where the electrons are emitted into the channel space by Fowler-Nordheim (F-N) tunneling.

Further, in the FET 10, the electrons are emitted from the surface of the impurity diffusion layer 18 provided on the surface of the semiconductor layer 11 in the normal direction from the surface of the impurity diffusion layer 18 to the channel space 24, so that the electrons are efficiently emitted from a large area. Therefore, the emission amount of the electrons can be increased and the source-drain current can be increased as compared with a conventional configuration in which the impurity diffusion layer 18 is not provided.

While the case in which the FET 10 is an n-type FET has been described above, the FET 10 can be a p-type FET by replacing the semiconductor layer 11 with an n-type semiconductor substrate or an n-well and replacing the impurity diffusion layer 18 with a p-type impurity diffusion layer. In the case where the FET 10 is a p-type FET, holes serving as the charge carriers are emitted into the channel space 24, travel through the channel space 24, and then reach the drain layer 17. In this case, the gate-source voltage $V_{GS}$ is applied such that the gate layer 15 has a negative voltage with respect to the backside electrode 19 and the impurity diffusion layer 18 serving as the source electrode, and the drain-source voltage $V_{DS}$ is applied such that the drain layer 17 has a negative voltage with respect to the impurity diffusion layer 18 and the backside electrode 19.

Although the configuration in which the FET 10 that is an n-type FET is formed in the p-type semiconductor layer 11 has been described above, the FET 10 that is an n-type FET may be formed in the n-type semiconductor layer 11, and the FET 10 that is a p-type FET may be formed in the p-type semiconductor layer 11. In such configuration, a PN junction is not formed between the semiconductor layer 11 and the impurity diffusion layer 18. For example, the laminated body 12 is formed on the n-type semiconductor layer 11 or the N-well, and an n+ impurity diffusion layer 18 is formed on the surface of the laminated body, and the PN junction is not formed between the semiconductor layer 11 and the impurity diffusion layer 18. This is effective when one FET or a plurality of FETs of the same type (p-type or n-type) are provided on the semiconductor substrate. In such a case, a parasitic capacitance and a junction leakage caused by the PN junction are eliminated, and the high-speed performance and the reliability of the FET 10 can be improved. Additionally, although the impurity diffusion layer 18 is used as the conductive layer, the conductive layer may be formed of a conductive material such as the metal.

Although an example in which the inversion layer is formed on the surface of the semiconductor layer 11 in contact with the first insulating layer 14 and the charge carriers are emitted has been described above, by applying the gate-source voltage $V_{GS}$ in a direction opposite to the above direction, the accumulation layer in which majority carriers of the semiconductor layer 11 are accumulated on the surface of the semiconductor layer 11 in contact with the first insulating layer 14 may be formed, and the majority carriers may be emitted as the charge carriers into the channel space. In this case, the drain-source voltage $V_{DS}$ is also applied in the direction opposite to the above direction.

Figure 4:
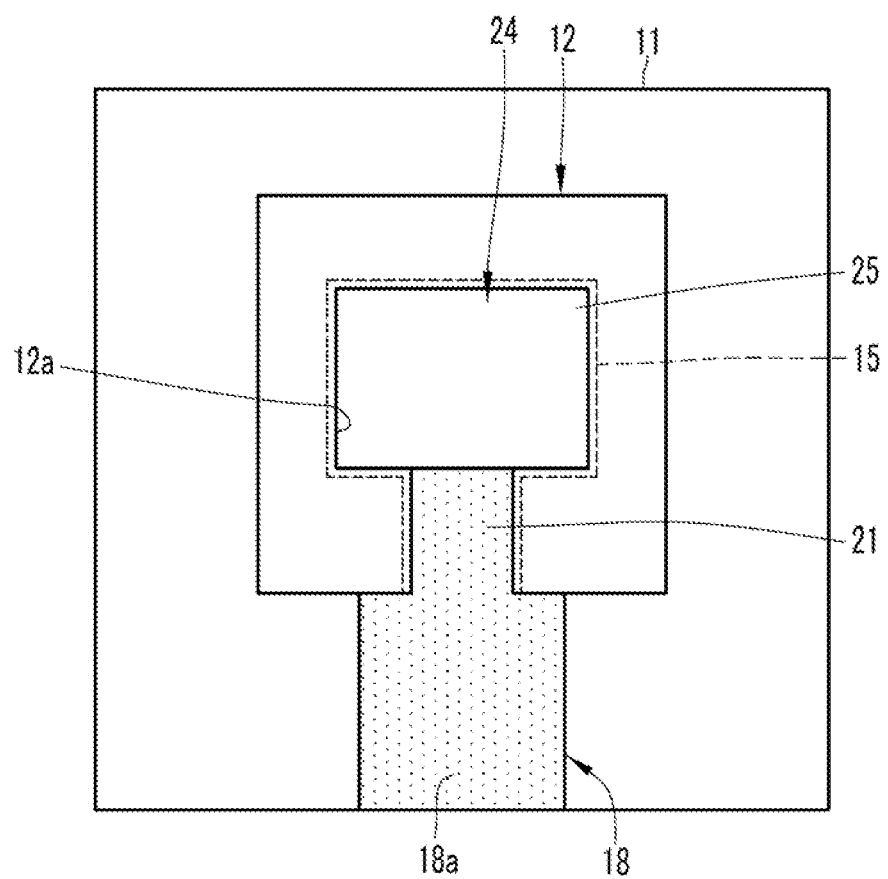
FIG. 4 is a plan view of the FET illustrating another forming region of the impurity diffusion layer on the semiconductor layer.
Figure 5:
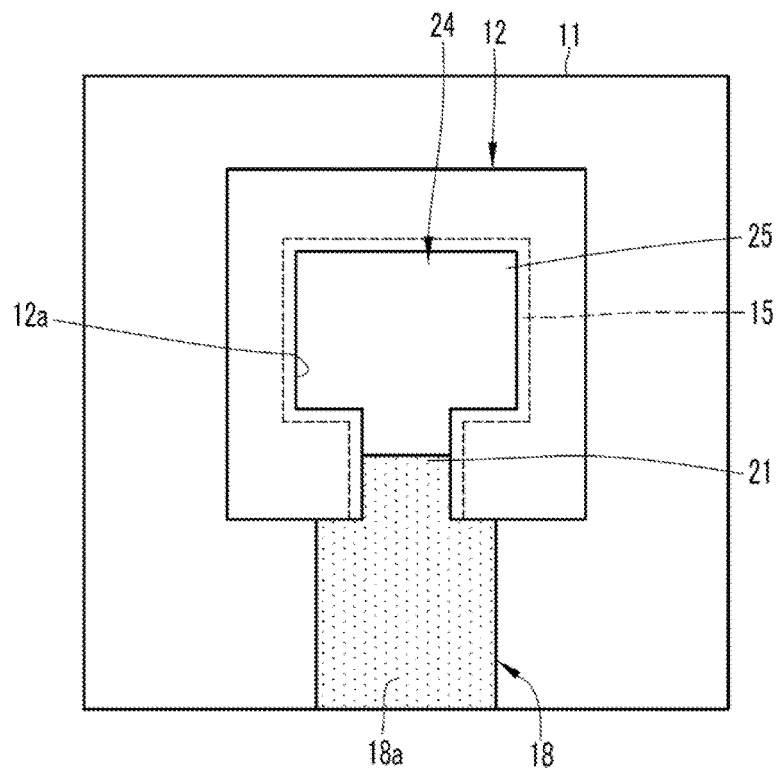
FIG. 5 is a plan view of the FET illustrating an example in which the impurity diffusion layer is extended from a region of a gap on the semiconductor layer.
Figure 6:
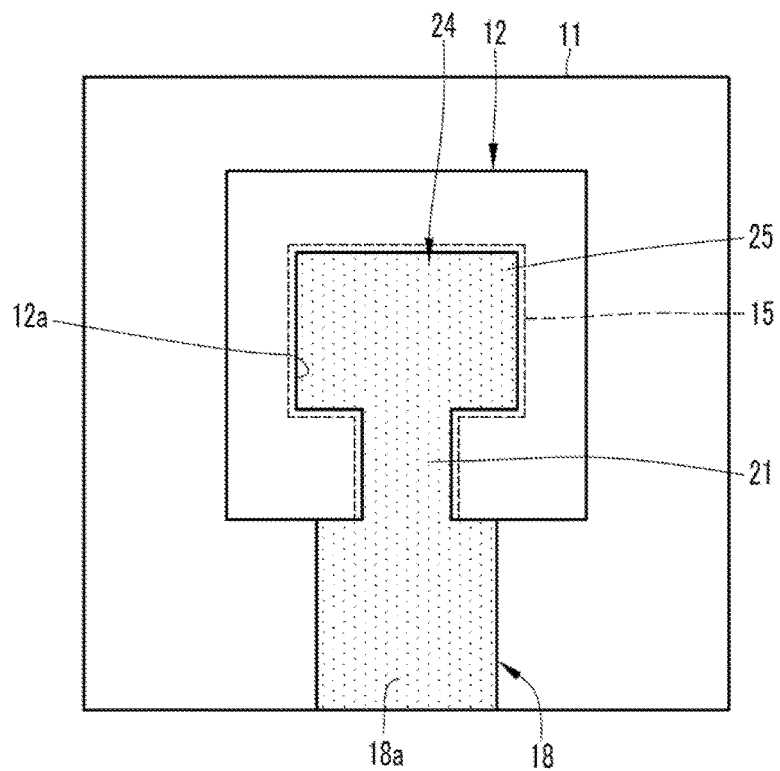
FIG. 6 is a plan view of the FET illustrating an example in which the impurity diffusion layer is formed on an entire channel space on the semiconductor layer.

Further, in the above description, the end portion of the impurity diffusion layer 18 as the conductive layer on the channel space 24 side is located in the space 25 on the surface of the semiconductor layer 11, but the position of the end portion of the impurity diffusion layer 18 on the channel space 24 side is not limited thereto. For example, as illustrated in FIG. 4, the end portion of the impurity diffusion layer 18 on the channel space 24 side may be at a position of a boundary between the gap 21 and the space 25, and as illustrated in FIG. 5, may be at a position in the gap 21. In the examples of FIGS. 4 and 5, the impurity diffusion layer 18 is in contact with merely two surfaces sandwiching the gap 21 of the side walls 12a. In the examples illustrated in FIGS. 3 to 5, a region where the impurity diffusion layer 18 is not formed is formed on the surface of the semiconductor layer 11 in the channel space 24. Additionally, as illustrated in FIG. 6, the impurity diffusion layer 18 may be formed so as to cover the entire surface of the semiconductor layer 11 in the channel space 24.

Figure 7:
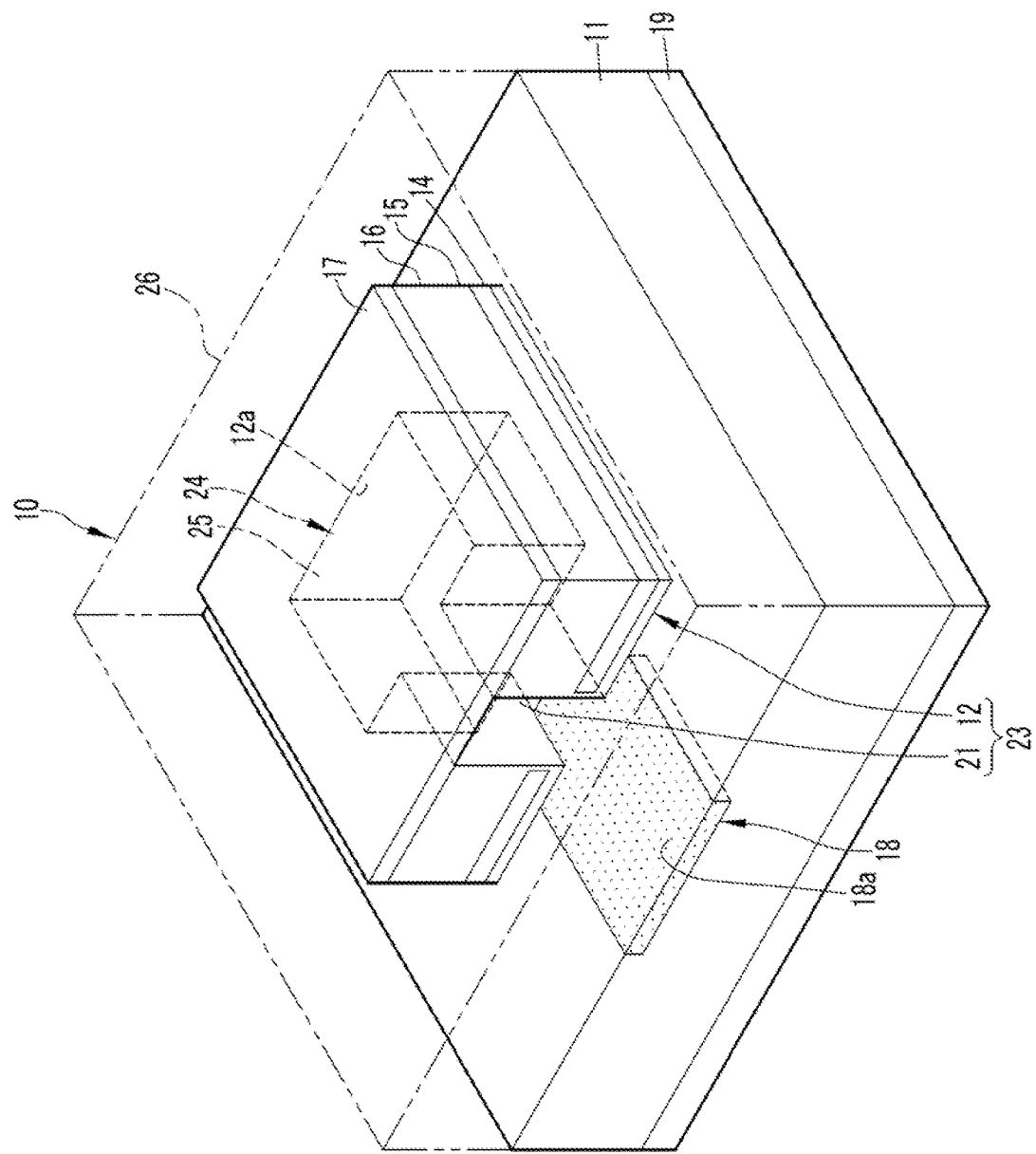
FIG. 7 is a perspective view illustrating an example in which an upper opening of the channel space of the FET is closed by a drain layer.

Further, in the above example, the drain layer 17 is provided merely on the upper portion of the laminated body 12, but as illustrated in FIG. 7, the drain layer 17 may be provided so as to cover and close the upper opening of the channel space 24. In this case, for example, before forming the drain layer 17, the filler is deposited to include the inside of the channel space 24, and the filler is set to the same height as the laminated body 12. Thereafter, for example, the Al (aluminum) film to be the drain layer 17 is formed, and the Al film may be processed into the shape of the drain layer 17. Then, the FET 10 can be manufactured in the same procedure as described above.

Figure 8:
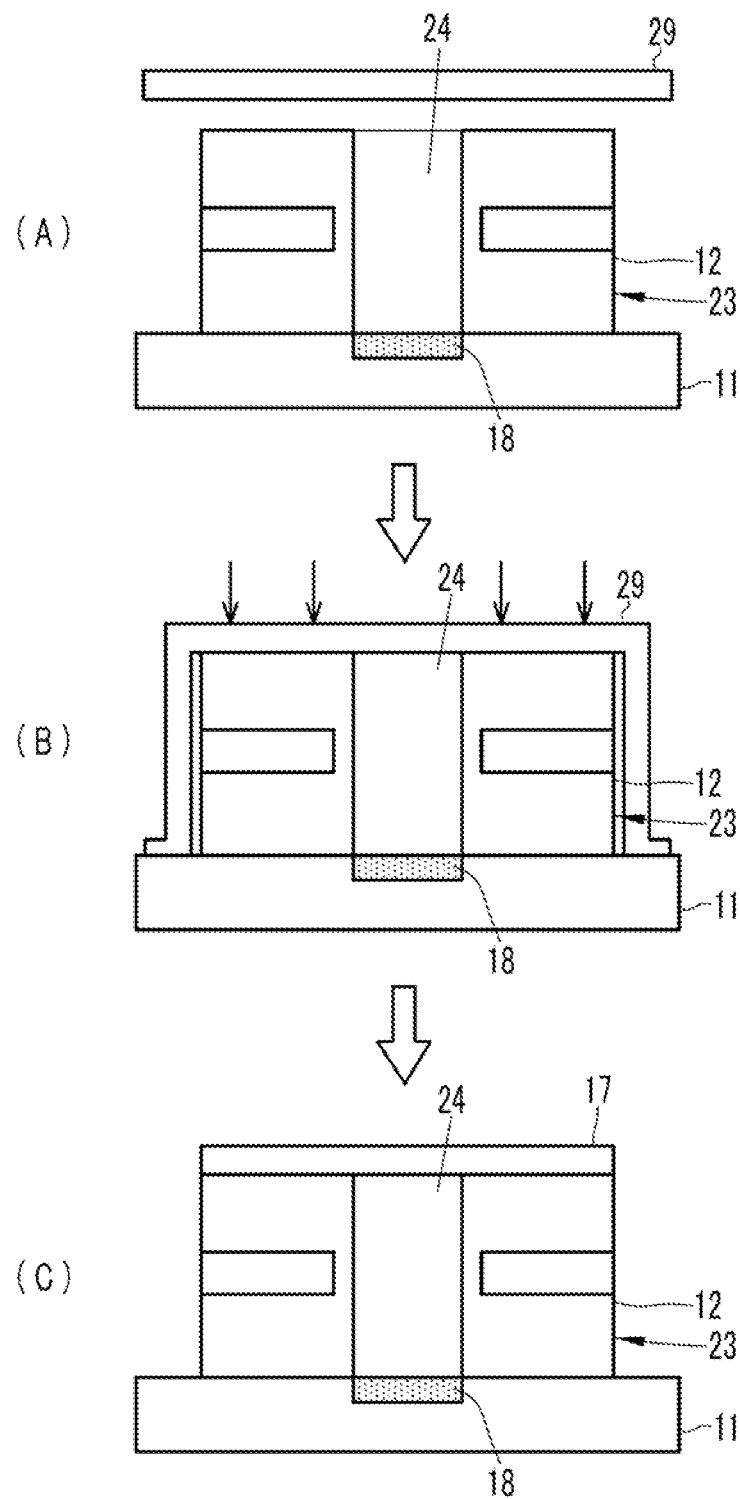
FIG. 8 is an explanatory diagram illustrating an example of a procedure of closing an upper portion of the channel space.

Further, when the drain layer 17 is formed so as to close the upper opening of the channel space 24, as illustrated in FIG. 8(A), the thin film 29 to be the drain layer 17 is placed on the annular portion 23, and accordingly, as illustrated in FIG. 8(B), the thin film 29 is pressure-bonded by applying a pressure, and afterwards, as illustrated in FIG. 8(C), an unnecessary portion of the thin film 29 can be etched and removed to form the drain layer 17. Moreover, the heat treatment may be added in order to increase a degree of adhesion between the thin film and the substrate, and when it is desired to reduce the film thickness of the thin film 29, etching for pattern formation may be performed so as to remove the unnecessary portion after the thin film 29 is etched to have a predetermined film thickness after a pressure bonding. Additionally, a similar method can also be used in the case of forming the insulating film, the fluorescent electrode portion to be described later, and the like.

Figure 9:
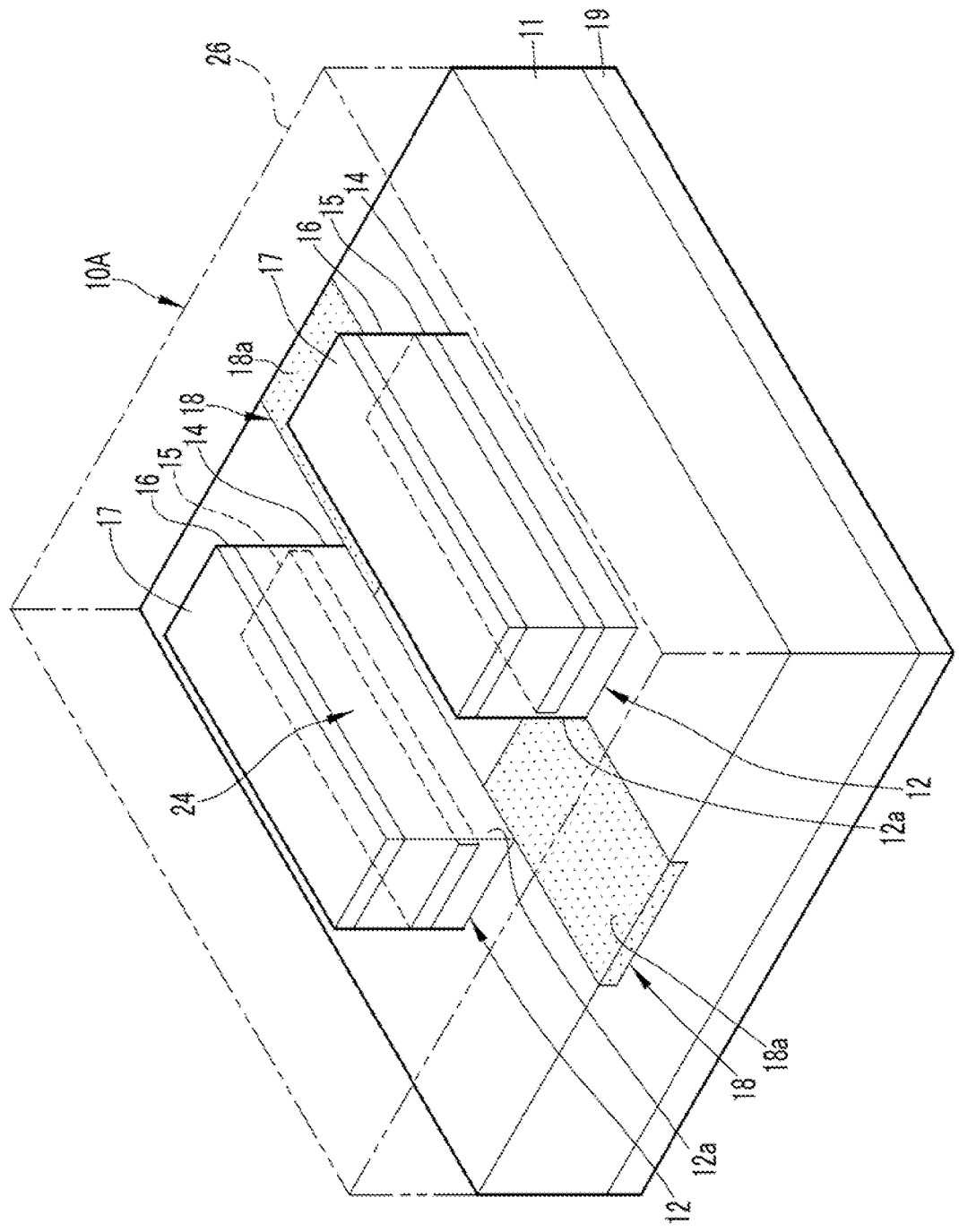
FIG. 9 is a perspective view illustrating the FET provided with a pair of laminated bodies.

As illustrated in FIG. 9, a pair of laminated bodies 12 may be provided on the semiconductor layer 11 so as to sandwich the channel space 24. In the FET 10A illustrated in FIG. 9, the pair of laminated bodies 12 is formed on the semiconductor layer 11. Each of the pair of laminated bodies 12 has a rectangular parallelepiped shape, and is provided plane-symmetrically such that the side walls 12a face each other with a predetermined interval. Similarly to the above, in the laminated body 12, the first insulating layer 14, the gate layer 15, the second insulating layer 16, and the drain layer 17 are layered in this order from the semiconductor layer 11 side. Additionally, in the FET 10A of this example, a pair of impurity diffusion layers 18 is formed as the conductive layers on the surface of the semiconductor layer 11.

In the FET 10A, a space sandwiched between the side walls 12a of the pair of laminated bodies 12 is the channel space 24, and the channel space 24 is defined by the side walls 12a of the pair of laminated bodies 12 facing each other. In the FET 10A, the cover layer 26 is provided so as to cover the upper portion and the periphery of the pair of laminated bodies 12 and the channel space 24. Accordingly, the channel space 24 is a closed space in which openings at both ends and the upper opening in a direction (hereinafter, referred to as a first direction) orthogonal to the normal direction of the surface of the semiconductor layer 11 and the direction in which the laminated body 12 is arranged are closed by the cover layer 26. Additionally, the drain layer 17 extending over the upper portions of each of the second insulating layers 16 may be provided, and the upper opening of the channel space 24 may be closed by the drain layer 17. In either case, the FET 10A can be manufactured in the same procedure as described above.

Of the pair of impurity diffusion layers 18, one of the impurity diffusion layers 18 extends from a position in contact with the side walls 12a in the channel space 24 to the outside of the channel space 24, that is, beyond one end of the laminated body 12, through a region of the opening which is the non-forming region at one end of the channel space 24 in the first direction on the surface of the semiconductor layer 11. The other impurity diffusion layer 18 extends from a position in contact with the side walls 12a in the channel space 24 to the outside of the channel space 24, that is, the other end of the laminated body 12, through the region of the opening which is the non-forming region at the other end of the channel space 24 in the first direction on the surface of the semiconductor layer 11. The outside regions 18a of the channel space 24 of each impurity diffusion layer 18 each are used as the contact regions.

Additionally, in the pair of impurity diffusion layers 18, the end portions in the channel space 24 are formed apart from each other, and a region where the impurity diffusion layer 18 is not formed is provided in the channel space 24 on the surface of the semiconductor layer 11, but the impurity diffusion layer 18 may be provided so as to cover the entire surface of the semiconductor layer 11 in the channel space 24. In this case, only one end of the impurity diffusion layer 18 may extend beyond one end of the laminated body 12.

When the above FET 10A is operated, the same gate-source voltage $V_{GS}$ may be applied to the gate layers 15 of the pair of laminated bodies 12, and the same drain-source voltage $V_{DS}$ may be applied to the drain layers 17. Accordingly, in each laminated body 12, the charge carriers are emitted from the surface of the semiconductor layer 11 in contact with the first insulating layer 14 and the surface of the impurity diffusion layer 18 into the channel space 24 and move to the drain layer 17, and the drain-source current $I_{DS}$ flows.

The FETs 10 and 10A in the above example can also be used as light detection elements. In this case, the member on the light incident path in the laminated body 12 is formed of a transparent material such that the light is incident on the surface of the semiconductor layer 11 in contact with the first insulating layer 14.

For example, in the FET 10, in a case where the light is incident on the interface between the semiconductor layer 11 and the first insulating layer 14 (the surface of the semiconductor layer 11) from above the FET, that is, from above the drain layer 17, the gate layer 15 and the drain layer 17 may be formed of a transparent conductive film that transmits the light and has a conductivity, for example, ITO (indium tin oxide), and the first insulating layer 14, the second insulating layer 16, and the cover layer 26 may be formed of a transparent silicon oxide ($SiO_2$), for example. Further, when the light is incident from the side of the first insulating layer 14, the first insulating layer 14 and the cover layer 26 may be formed of the transparent material such as the silicon oxide ($SiO_2$).

When the FET 10 is used as the light detection element, the gate-source voltage $V_{GS}$ and the drain-source voltage $V_{DS}$ are applied in the same manner as described above, but the gate-source voltage $V_{GS}$ is adjusted so as to form the depletion layer on the surface of the semiconductor layer 11, for example. Accordingly, when the light is incident on the interface between the semiconductor layer 11 and the first insulating layer 14, electron-hole pairs generated in the depletion layer on the surface of the semiconductor layer 11 are thereby separated by the electric field in the depletion layer, and the electrons are accumulated on the surface of the semiconductor layer 11. Subsequently, the electrons are emitted to the channel space 24 by the Coulomb repulsive force generated between the electrons, and the emitted electrons move in the channel space 24 and reach the drain layer 17, so that the drain current flows. In other words, the FET 10 is turned on. In this manner, a light detection can be performed depending on the presence or absence of the drain current of the FET 10, and the drain current corresponding to the intensity of the incident light can flow. Additionally, the same applies to the FET 10A. And in this configuration, the impurity diffusion layer 18 can be omitted. When the impurity diffusion layer 18 is not provided, the predetermined voltage (potential) may be applied to the semiconductor layer 11 from the diffusion layer of the same type as the semiconductor layer 11 provided on the backside electrode 19 or the surface of the semiconductor layer 11.

When the FETs 10 and 10A are used as the light detection elements as described above, the light detection sensitivity can be managed by regulating the gate voltage to control the formation of the depletion layer, and the magnitude of a photocurrent can be managed by controlling the drain voltage. Such an effect can be obtained even in a configuration in which the impurity diffusion layer 18 is not provided, and thus it is also useful in a configuration in which the impurity diffusion layer 18 is omitted.

Second Embodiment

Figure 10:
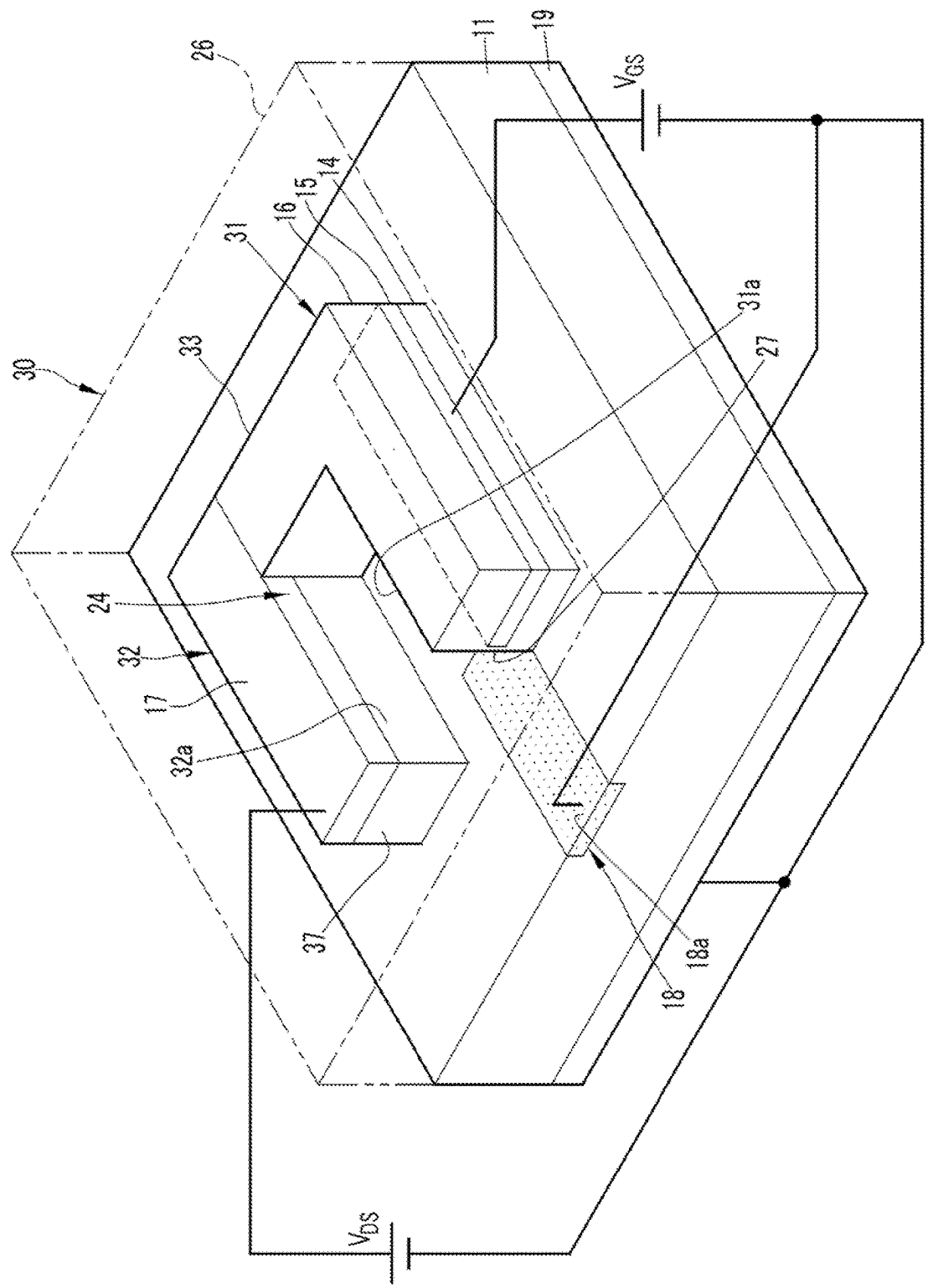
FIG. 10 is a perspective view illustrating an example of the FET in which a gate layer and the drain layer are disposed apart from each other in an in-plane direction of the semiconductor layer.

FIG. 10 illustrates an FET 30 as the vacuum channel electronic element according to the second embodiment. In the FET 30, the gate layer 15 and the drain layer 17 are disposed in the in-plane direction of the semiconductor layer 11 with the channel space 24 interposed therebetween.

Additionally, since the present embodiment is similar to the first embodiment except that details will be described below, members that are substantially the same are denoted by the same reference numerals and a detailed description thereof will be omitted.

In the FET 30 of this example, a first laminated body 31 including the gate layer 15 and a second laminated body 32 including the drain layer 17 are formed on the semiconductor layer 11. Both the first laminated body 31 and the second laminated body 32 have the rectangular parallelepiped shape, and are provided such that side wall 31a as the first side walls of the first laminated body 31 and side wall 32a as the second side walls of the second laminated body 32 face each other in parallel at a predetermined interval. In addition, a connecting portion 33 for connecting the first laminated body 31 and the second laminated body 32 is provided at an end portion of the first laminated body 31 and the second laminated body 32. In this example, a space sandwiched between the side wall 31a of the effective first laminated body 31 and the side wall 32a of the second laminated body 32, which are not hidden by the connecting portion 33, is the channel space 24, and the channel space 24 is defined by the side wall 31a and the side wall 32a.

In the first laminated body 31, the first insulating layer 14, the gate layer 15, and the second insulating layer 16 are layered in this order from the semiconductor layer 11 side, and the side wall 31a thereof are formed by the end surface of the first insulating layer 14, the insulating film 27 formed on the end surface of the gate layer 15, and an end surface of the second insulating layer 16. In the second laminated body 32, a third insulating layer 37 that is insulating and the drain layer 17 are layered in this order from the semiconductor layer 11 side, and the side wall 32a thereof are formed by the end surface of the third insulating layer 37 and the end surface of the drain layer 17. The side wall 31a and 32a are exposed to the channel space 24. The third insulating layer 37 is formed of the insulating material, for example, the silicon oxide, similarly to the first insulating layer 14 and the second insulating layer 16. Additionally, the third insulating layer 37 has preferably a thickness such that the charge carriers accumulated on the surface in contact with the third insulating layer 37 of the semiconductor layer 11 are emitted into the channel space 24 and do not move to the drain layer 17 when the drain-source voltage $V_{DS}$ is applied.

On the surface of the semiconductor layer 11, the impurity diffusion layer 18 is formed on the end portion side opposite to the connecting portion 33 of the channel space 24. On the surface of the semiconductor layer 11, the impurity diffusion layer 18 extends from a position in contact with the side wall 31a in the channel space 24 to extend beyond the outside of the channel space 24, that is, one end of the first laminated body 31, through a region of an opening which is the non-forming region on an end portion side opposite to the connecting portion 33 of the channel space 24, and the outside regions 18a are used as the contact regions. The impurity diffusion layer 18 is provided so as not to contact the second laminated body 32 including the side wall 32a. In this example, the impurity diffusion layer 18 is provided so as to be in contact with a part of the effective side wall 31a, but the impurity diffusion layer 18 may be provided so as to be in contact with all the side wall 31a in the channel space 24.

In the FET 30, the cover layer 26 is provided so as to cover the upper portions and the peripheries of the first laminated body 31, the second laminated body 32, the connecting portion 33, and the channel space 24. Accordingly, the channel space 24 becomes the closed space. Also in this case, the channel space 24 can be easily formed to be the closed space by a method of forming the cover layer 26 on the upper portion of the channel space 24 by depositing the filler including the inside of the channel space 24 after the formation of the drain layer 17.

Also in the FET 30, similarly to the first embodiment, the gate-source voltage $V_{GS}$ is applied between the gate layer 15 and the source electrode, and the drain-source voltage $V_{DS}$ is applied between the drain layer 17 and the source electrode. Accordingly, on the first laminated body 31 side, the charge carriers are emitted from the edge of the surface of the semiconductor layer 11 in contact with the first insulating layer 14 and the surface of the impurity diffusion layer 18 to the channel space 24 by the gate-source voltage $V_{GS}$. Subsequently, the charge carriers emitted into the channel space 24 move in the channel space 24 from the first laminated body 31 side toward the drain layer 17 of the second laminated body 32 by the drain-source voltage $V_{DS}$, and are captured by the drain layer 17. Accordingly, the drain-source current $I_{DS}$ flows.

In the above example, the gate layer 15 and the drain layer 17 are not provided in the connecting portion 33, but the connecting portion 33 may have a layer structure of any one of the first laminated body 31 and the second laminated body 32. Further, the openings at both ends of the channel space 24 may be closed by the cover layer 26 without providing the connecting portion 33.

The above FET 30 can also be used as the light receiving element (the light detection element). In this case, the light may be incident on the interface between the semiconductor layer 11 and the first insulating layer 14 (the surface of the semiconductor layer 11). Specifically, for example, when the light is incident on the interface between the semiconductor layer 11 and the first insulating layer 14 from above the FET 30, the gate layer 15 and the drain layer 17 may be respectively formed of the transparent conductive film that transmits the light and has the conductivity, for example, ITO (indium tin oxide), and the first insulating layer 14, the second insulating layer 16, and the cover layer 26 may be formed of the transparent silicon oxide ($SiO_2$), for example. Further, when the light is incident from the side of the first insulating layer 14, the first insulating layer 14 and the cover layer 26 may be formed of the transparent material such as the silicon oxide ($SiO_2$). Additionally, also in this configuration, the impurity diffusion layer 18 can be omitted.

Third Embodiment

Figure 11:
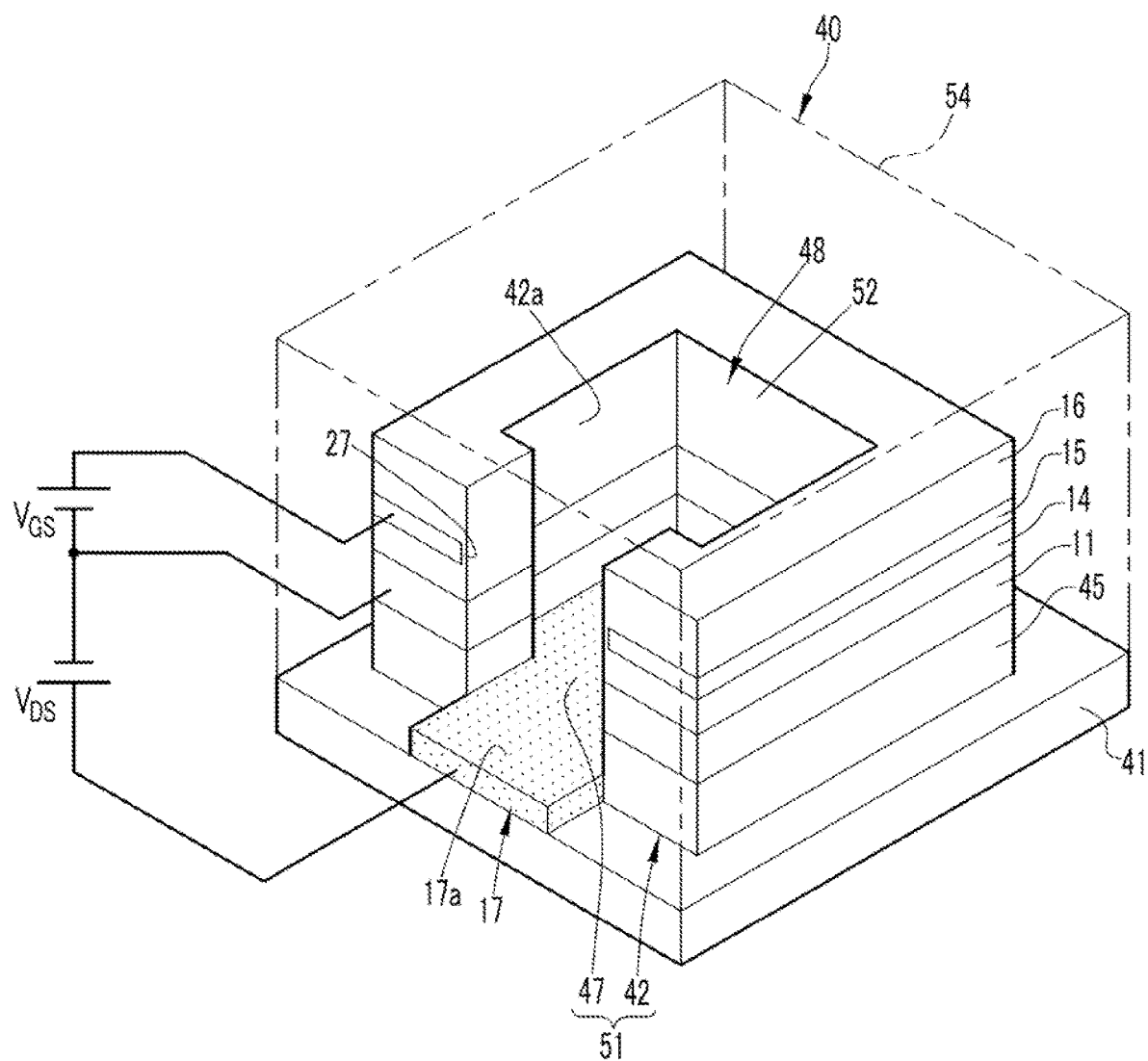
FIG. 11 is a perspective view illustrating an example of the FET in which the semiconductor layer is disposed between the gate layer and the drain layer.

FIG. 11 illustrates an FET 40 as the vacuum channel electronic element according to the third embodiment. The FET 40 has a configuration in which the semiconductor layer 11 is disposed between the gate layer 15 and the drain layer 17. Additionally, since the present embodiment is similar to the first embodiment except that details will be described below, members that are substantially the same are denoted by the same reference numerals and a detailed description thereof will be omitted.

In the FET 40, a laminated body 42 is formed on a substrate 41 as the base layer formed of the insulating material. In the laminated body 42, a base insulating layer 45 formed of the insulating material, the p-type or n-type semiconductor layer 11 as the source, the first insulating layer 14, the gate layer 15, and the second insulating layer 16 are layered in this order from the substrate 41 side. The laminated body 42, similarly to the laminated body 12 (see FIG. 1) of the first embodiment, has a shape provided with a gap 47 obtained by cutting out a part of the quadrangular cylindrical shape extending in the upper direction in the vertical direction, and is provided in a circumferential shape in which the gap 47 is formed in a part of the circumferential direction.

A space defined by side walls 42a of the above laminated body 42 is a channel space 48. In other words, a space 52 surrounded by an annular portion 51 including the laminated body 42 and the gap 47, and the gap 47 that is a space sandwiched by the side walls 42a facing each other at the predetermined interval constitute the channel space 48. The insulating film 27 is formed on the end surface of the gate layer 15 on the channel space 48 side. Further, strictly speaking, a space between the drain layer 17 provided on the substrate 41 and the interface between the first insulating layer 14 and the semiconductor layer 11 as described later is a space where the charge carriers move.

Further, the drain layer 17 is provided on the substrate 41. The drain layer 17 extends from the region in the channel space 48 to the outside of the laminated body 42 through the region of the gap 47 on the surface of the substrate 41. In other words, the drain layer 17 extends from the region in the channel space 48 to an outer peripheral region of the laminated body 42 beyond the laminated body 42 through the non-forming region where the laminated body 42 is not formed. A region 17a beyond the laminated body 42 is the contact region to which the wiring for applying the predetermined voltage to the drain layer 17 is connected. In this example, in the channel space 48, the drain layer 17 is formed so as to cover the entire region in the channel space 48 of the substrate 41. Additionally, the laminated body 42 may be provided in a closed annular shape without providing the gap 47, and the drain layer 17 may be formed merely in the channel space 48.

A cover layer 54 is provided so as to cover the periphery and the upper portion of the annular portion 51. Accordingly, the upper surface of the channel space 48 and the opening of the gap 47 are closed to form the closed space. The cover layer 54 is made of the insulating material (for example, the silicon oxide ($SiO_2$)). Similarly to the first embodiment, the channel space 48 can be formed as the closed space by using a method of forming the cover layer 54 on the upper portion of the channel space 48 by depositing the filler including the inside of the channel space 48 after the formation of the drain layer 17. Additionally, the channel space 48 may be a space whose upper portion and periphery are open. Therefore, for example, the laminated body 42 may be formed in the rectangular parallelepiped shape on the substrate 41, and a space facing the side walls 42a of one surface of the laminated body 42 may be used as the channel space.

The above FET 40 can be manufactured using, for example, an SOI substrate in which a BOX layer (a $SiO_2$ film) and a silicon film are layered on the silicon substrate. In this case, the BOX layer may be the substrate 41 and the base insulating layer 45, and the silicon film formed on the BOX layer may be the semiconductor layer 11. In a case where a part of the BOX layer is used as the base insulating layer 45 as described above, the drain layer 17 may be formed after the portion of the BOX layer forming the drain layer 17 is etched deeper than the thickness of the drain layer 17. Additionally, in this case, a boundary between the substrate 41 and the base insulating layer 45 may not be confirmed.

In the case of using the FET 40, to apply a positive voltage to the gate layer 15 and the drain layer 17, a gate-source voltage $V_{GS}$ is applied between the gate layer 15 and the semiconductor layer 11, and the drain-source voltage $V_{DS}$ is applied between the drain layer 17 and the semiconductor layer 11. Accordingly, the electrons as the charge carriers are emitted from the edge of the surface of the semiconductor layer 11, which is the interface with the first insulating layer 14, to the channel space 48 by the gate-source voltage $V_{GS}$. Subsequently, the electrons emitted to the channel space 48 move in the channel space 48 toward the drain layer 17 by the drain-source voltage $V_{DS}$ and are captured by the drain layer 17. Accordingly, the drain-source current $I_{DS}$ flows. Additionally, also in this example, the gate-source voltage $V_{GS}$ and the drain-source voltage $V_{DS}$ may be respectively applied in directions opposite to the above directions to emit the holes as the charge carriers, and the holes may be captured by the drain layer 17. In addition, instead of forming the inversion layer in the semiconductor layer 11, the accumulation layer may be formed.

The FET 40 can also be used as the light receiving element (the light detection element), a photoelectric conversion element, or the like. Also in this case, the light may be incident on the interface between the semiconductor layer 11 and the first insulating layer 14 (the surface of the semiconductor layer 11). Accordingly, when the light is incident from above the FET 40, the first insulating layer 14, the gate layer 15, the second insulating layer 16, and the cover layer 54 are formed of the transparent material. Further, when the light is incident from the side of the first insulating layer 14, the first insulating layer 14 and the cover layer 54 are formed of the transparent material.

Fourth Embodiment

Figure 12:
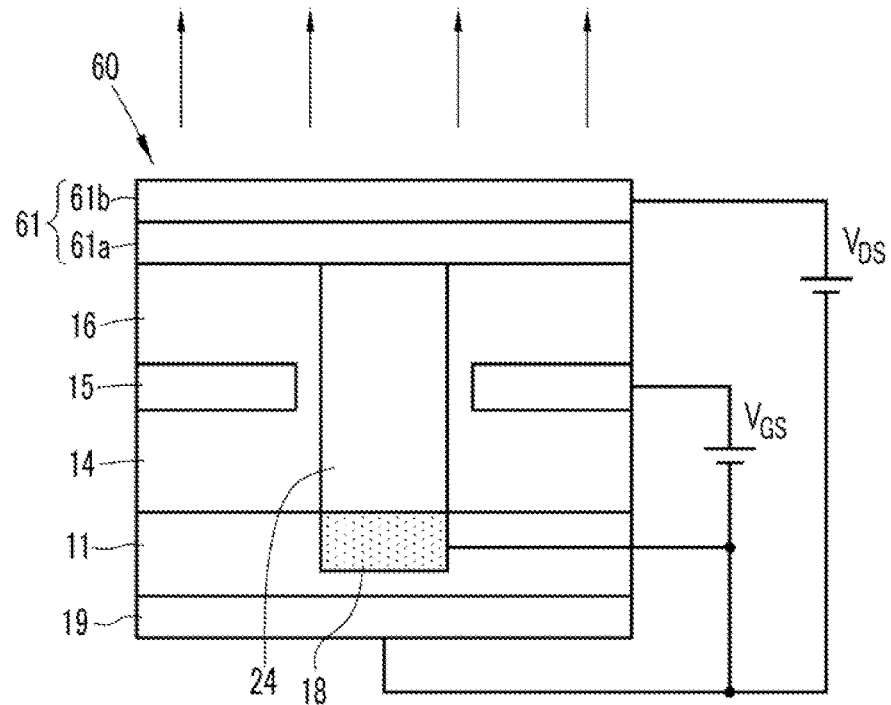
FIG. 12 is a cross-sectional view illustrating a cross-sectional structure of a light emitting element.

FIG. 12 illustrates a light emitting element 60 as the vacuum channel electronic element of the fourth embodiment. Since the light emitting element 60 has the same configuration as the FET 10 illustrated in FIG. 7 except that the fluorescent electrode portion 61 is used as the drain layer, the members that are substantially the same are denoted by the same reference numerals and the detailed description thereof will be omitted. Additionally, in FIG. 12, a hatching of the cross section is omitted. Similarly, the hatching of the cross section is omitted in FIGS. 13 to 15.

In the light emitting element 60, the fluorescent electrode portion 61 is provided as the drain layer provided above the channel space 24. In this example, the fluorescent electrode portion 61 has a two-layer structure of a phosphor layer 61a and a transparent electrode layer 61b, and the phosphor layer 61a is disposed on the channel space 24 side. Accordingly, a part of the phosphor layer 61a is exposed to the channel space 24. The phosphor layer 61a is formed by forming a phosphor that emits the light by incidence of the electrons in a layer shape (a thin film shape). The transparent electrode layer 61b is a transparent conductive film that transmits the light and has the conductivity, and is formed of, for example, ITO (indium tin oxide). The drain-source voltage $V_{DS}$ is applied to the transparent electrode layer 61b.

The electrons emitted from the edge of the surface of the semiconductor layer 11, which is the interface with the first insulating layer 14, to the channel space 24 by the application of the gate-source voltage $V_{GS}$ are incident on the phosphor layer 61a by the drain-source voltage $V_{DS}$. Accordingly, the phosphor layer 61a emits light, and the light is transmitted through the transparent electrode layer 61b and emitted to the outside of the light emitting element 60.

Figure 13:
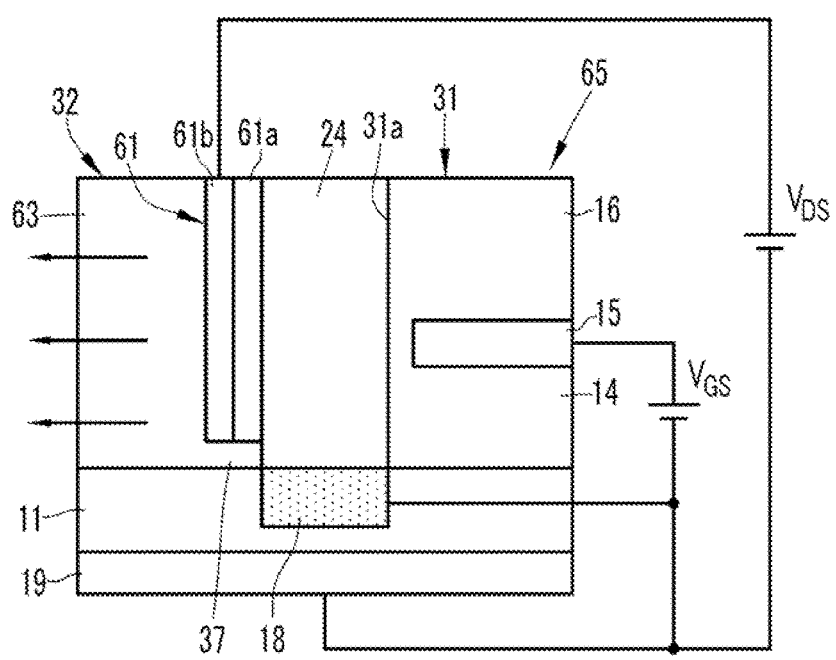
FIG. 13 is a cross-sectional view illustrating the cross-sectional structure of the light emitting element in which the gate layer and a fluorescent electrode portion are disposed apart from each other in the in-plane direction of the semiconductor layer.

In a light emitting element 65 illustrated in FIG. 13, the gate layer 15 and the fluorescent electrode portion 61 are disposed with the channel space 24 interposed therebetween in the in-plane direction of the semiconductor layer 11. Additionally, since the configuration of the light emitting element 65 is the same as that of the FET 30 of the second embodiment except that details will be described below, the members that are substantially the same are denoted by the same reference numerals and a detailed description thereof will be omitted.

In the light emitting element 65, the fluorescent electrode portion 61 is provided on the second laminated body 32 as the drain layer. The fluorescent electrode portion 61 is disposed such that the phosphor layer 61a is exposed to the channel space 24, and faces the side wall 31a of the first laminated body 31 with the channel space 24 interposed therebetween. A transparent back insulating layer 63 is provided integrally with the third insulating layer 37 on a back surface side (a surface side opposite to the channel space 24) of fluorescent electrode portion 61. In the light emitting element 65, the electrons emitted from the semiconductor layer 11 on the first laminated body 31 side are incident on the phosphor layer 61a and emit the light from the phosphor layer 61a, and the light from the phosphor layer 61a is emitted to the outside through the transparent electrode layer 61b and the back insulating layer 63.

Further, in the above light emitting elements 60 and 65, when the cover layer is provided and the light from the phosphor layer 61a is emitted to the outside through the cover layer, the cover layer may be formed of a transparent insulating material, for example, the silicon oxide. Additionally, in the light emitting elements 60 and 65, the impurity diffusion layer 18 may be omitted as in the case of the light receiving element in the first embodiment.

Figure 14:
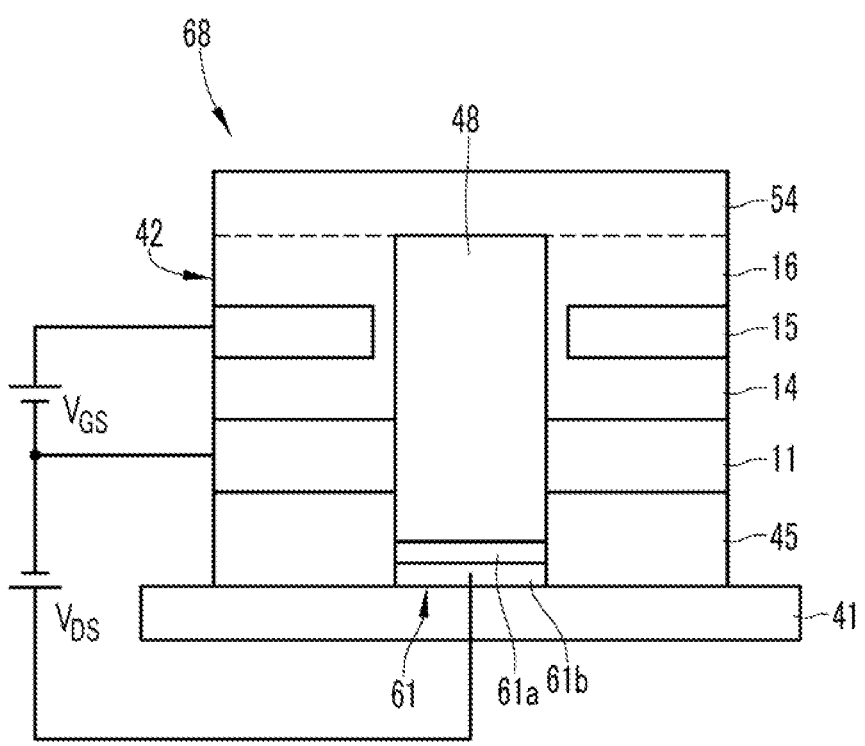
FIG. 14 is a cross-sectional view illustrating the cross-sectional structure of the light emitting element in which the semiconductor layer is disposed between the gate layer and the fluorescent electrode portion.

A light emitting element 68 illustrated in FIG. 14 has a configuration in which the semiconductor layer 11 is disposed between the gate layer 15 and the fluorescent electrode portion 61 as the drain layer. Additionally, since the configuration of the light emitting element 68 is the same as that of the FET 40 of the third embodiment except that details will be described below, the members that are substantially the same are denoted by the same reference numerals and a detailed description thereof will be omitted.

In the light emitting element 68, the fluorescent electrode portion 61 is provided as the drain layer on the substrate 41. In the fluorescent electrode portion 61, the transparent electrode layer 61b is disposed on the substrate 41 side, and the phosphor layer 61a is disposed so as to be exposed to the channel space 48. The substrate 41 is made of the transparent insulating material, for example, the silicon oxide, and the light from the phosphor layer 61a is emitted to the outside through the transparent electrode layer 61b and the substrate 41.

In each of the light emitting elements 60, 65, and 68 described above, the emission of the electrons is controlled by the gate-source voltage $V_{GS}$, and an incident speed of the electrons on the phosphor layer 61a, that is, a light emission intensity is controlled by the drain-source voltage $V_{DS}$, so that the emission and the light emission intensity of the electrons each can be optimally controlled. Accordingly, it is also possible to emit the electrons at a small gate-source voltage $V_{GS}$ at which an insulation property by the first insulating layer 14 is not damaged, and to increase the light emission intensity at the large drain-source voltage $V_{DS}$ at which the insulation property by the first insulating layer 14 is damaged. Further, in the above description, the fluorescent electrode portion 61 has a two-layer structure of the phosphor layer 61a and the transparent electrode layer 61b, but the configuration of the fluorescent electrode portion is not limited thereto. For example, merely a conductive material that emits the light by an electron ejection may be used.

Examples of such light-emitting conductive material include a compound synthesized by adding an Al compound to GaN, ZnO:Zn, $SrTiO_3:Pr^{3+}$, or $SrTiO_3: Pr^{3+}$, and a compound synthesized by adding the Al (aluminum), a Y (Yttrium), or the like to $SrIn_2O_4:Pr^{3+}$. These are preferable because a starting voltage of electron beam induced light emission is relatively low (for example, equal to or smaller than 10 V).

The configuration of the light emitting element as described above can be applied to, for example, a display device or the like such as a mobile phone or a TV. In other words, the display device can be configured using the light emitting element as a pixel.

Fifth Embodiment

The optical transmission circuit and an optical communication circuit can be configured by using one of the light receiving elements illustrated in the first to third embodiments and the light emitting element illustrated in the fourth embodiment, or by using both in combination. Additionally, the members that are substantially the same as those in the first to fourth embodiments are denoted by the same reference numerals, and a detailed description thereof will be omitted.

Figure 15:
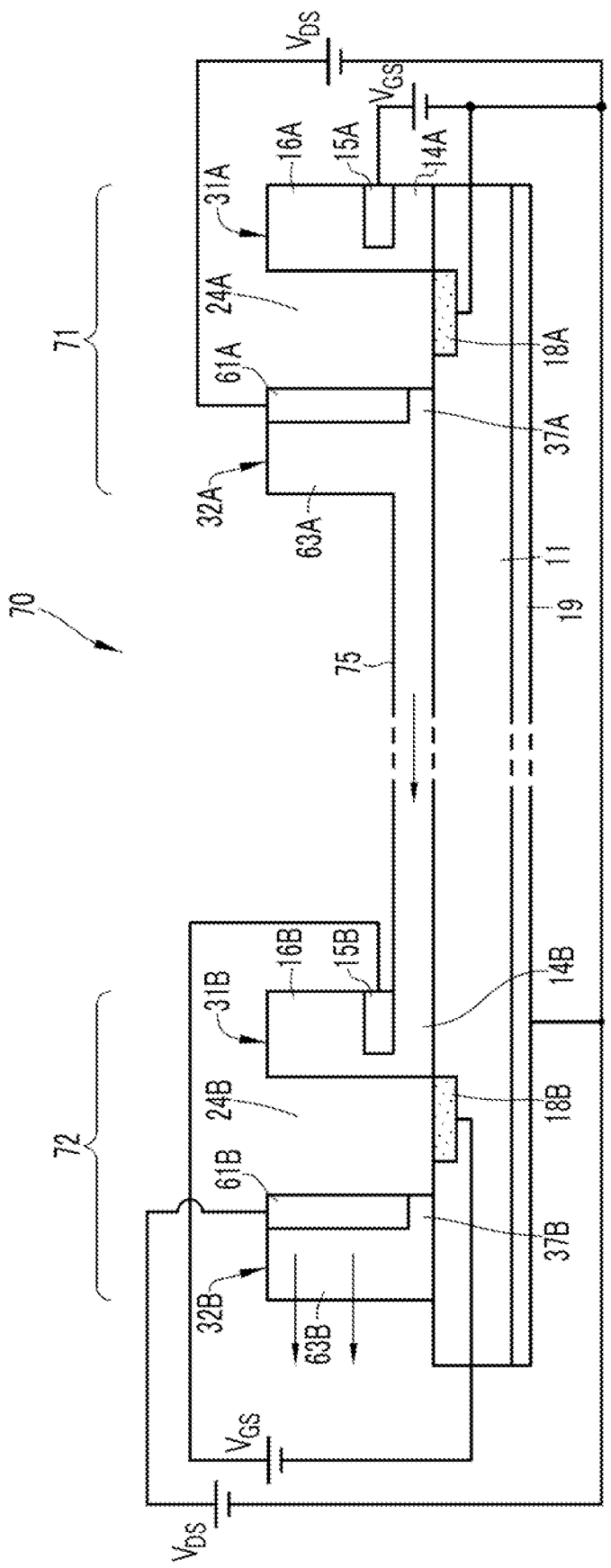
FIG. 15 is an explanatory diagram illustrating an example of an optical transmission circuit.

FIG. 15 illustrates an example in which optical transmission circuits 70 using the vacuum channel electronic element are provided on one substrate. Each of the optical transmission circuits 70 is configured to transmit an optical signal from an element 71, which is the vacuum channel electronic element, to an element 72.

The element 71 is provided with, on the semiconductor layer 11, a first laminated body 31A including a first insulating layer 14A, a gate layer 15A, and a second insulating layer 16A, a second laminated body 32A including a third insulating layer 37A, a fluorescent electrode portion 61A, and a back insulating layer 63A, and an impurity diffusion layer 18A, which are similar to those of the light emitting element 65 described above, and the first laminated body 31A and the second laminated body 32A are arranged with a channel space 24A interposed therebetween.

Also in the element 72, similarly to the light emitting element 65 described above, a first laminated body 31B including a first insulating layer 14B, a gate layer 15B, and a second insulating layer 16B, a second laminated body 32B including a third insulating layer 37B, a fluorescent electrode portion 61B, and a back insulating layer 63B, and an impurity diffusion layer 18B are provided on the semiconductor layer 11, and the first laminated body 31B and the second laminated body 32B are disposed with a channel space 24B interposed therebetween. The semiconductor layer 11 provided with the first laminated bodies 31A and 31B and the second laminated bodies 32A and 32B is common to the elements 71 and 72 and is the same substrate. On the backside surface of the semiconductor layer 11, the backside electrode 19 common to the elements 71 and 72 is provided. Additionally, the backside electrode electrically separated from the elements 71 and 72 may be provided.

The first insulating layers 14A and 14B, the second insulating layers 16A and 16B, the third insulating layers 37A and 37B, and the back insulating layers 63A and 63B are formed of, for example, the silicon oxide ($SiO_2$), and the semiconductor layer 11 is formed of, for example, a p-type silicon semiconductor. The backside electrode 19 is made of, for example, the Al (aluminum).

The light emission of the element 71 is controlled by the gate-source voltage $V_{GS}$ applied thereto. In other words, the element 71 is the light emitting element for an electrical input light output, and outputs the optical signal that is turned on or off or modulated by an increase or decrease in the gate-source voltage $V_{GS}$. In one element 72, an on/off control of the light from the element 71 or control of the light output level with respect to the light input level is performed by controlling the gate-source voltage. In other words, the element 72 functions as an element of light input light output, and is the light receiving element and the light emitting element at the same time. Additionally, the element 72 may be an element of light input electrical output that changes the drain current with respect to the light input.

On the semiconductor layer 11, a waveguide 75 formed of, for example, the silicon oxide ($SiO_2$) is provided between the second laminated body 32A of the element 71 and the first laminated body 31B of the element 72. An end portion of the waveguide 75 on the second laminated body 32A side is connected to and integrated with the third insulating layer 37A and the back insulating layer 63A, and an end portion of the waveguide 75 on the first laminated body 31B side is connected to and integrated with the first insulating layer 14B. Additionally, in this example, since the semiconductor layer 11 between the second laminated body 32A and the first laminated body 31B also functions as a part of the waveguide, it is preferable to set the width of the semiconductor layer 11 to the same extent as each laminated body (the length in the direction perpendicular to the paper surface of FIG. 15) from the viewpoint of reducing a loss.

In this example, the surfaces of the optical transmission circuits 70 are exposed into air having a refractive index lower than that of the first insulating layers 14A and 14B, the third insulating layers 37A and 37B, the back insulating layers 63A and 63B, the waveguide 75, and the semiconductor layer 11. Additionally, the elements 71 and 72 and the waveguide 75 may be covered with the cover layer. In this case, at least the portions covering the first insulating layers 14A and 14B, the third insulating layers 37A and 37B, the back insulating layers 63A and 63B, the waveguide 75, and the semiconductor layer 11 are formed of a material having a refractive index lower than those of the covered parts, so that the light is stopped from being leaked to the cover layer. In addition, it is preferable to form a film that blocks or reflects the light from the inside of the back insulating layer 63A on the surface of the back insulating layer 63A opposite to the fluorescent electrode portion 61.

According to the above configuration, a part of light from the fluorescent electrode portion 61A modulated according to the gate-source voltage $V_{GS}$ applied to the element 71 reaches the first insulating layer 14B of the element 72 via the back insulating layer 63A, the third insulating layer 37A, and the waveguide 75, and is incident on the interface between the semiconductor layer 11 and the first insulating layer 14B. Further, a part of the light incident on the waveguide 75 passes through the inside of the semiconductor layer 11, and is incident on the interface between the semiconductor layer 11 and the first insulating layer 14B from the region immediately below the first insulating layer 14B of the semiconductor layer 11. Accordingly, in the element 72, the electrons are accumulated on the surface of the semiconductor layer 11, and the electrons are emitted to the channel space 24B by the Coulomb repulsive force generated between the electrons. Subsequently, the emitted electrons move through the channel space 24B and enter the fluorescent electrode portion 61B, whereby the light is output from the fluorescent electrode portion 61B.

Figure 16:
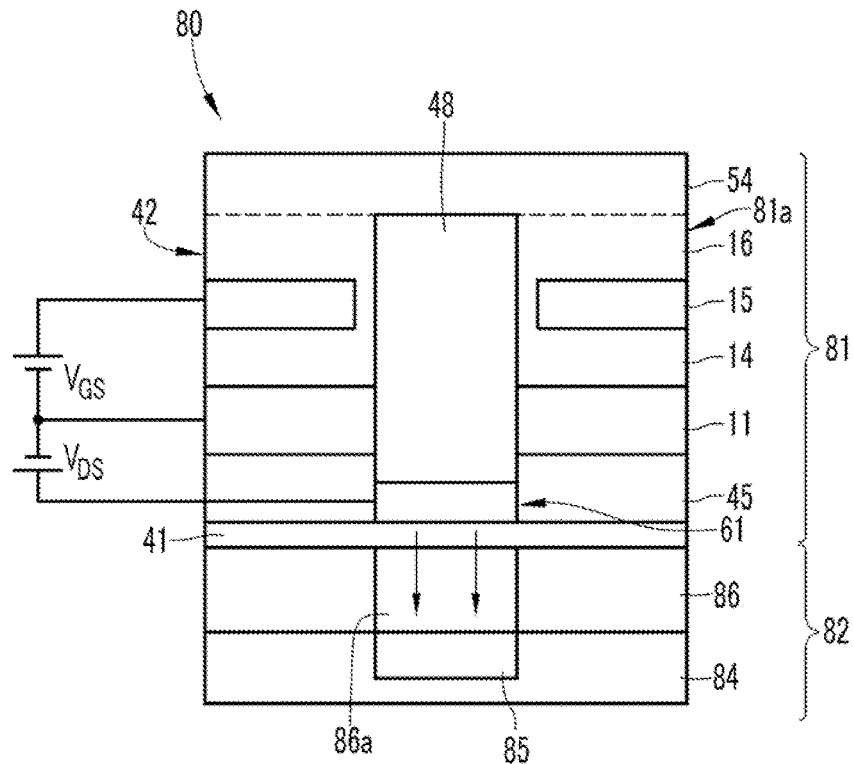
FIG. 16 is a cross-sectional view illustrating an example of a laminated chip.

FIG. 16 illustrates an example of inter-chip transmission in which signals are exchanged between chips laminated using the light emitting element configured as described above. The laminated chip (laminated MCP (multi-chip package)) 80 is obtained by laminating a chip 81 and a chip 82 in the vertical direction, and the chip 81 is disposed on the chip 82. Additionally, in this example, the chip 81 is the first chip, and the chip 82 is the second chip.

The chip 81 has the same configuration as the above light emitting element 68, and is provided with a light emitting element 81a that outputs light from the fluorescent electrode portion 61 provided on the substrate 41 downward through the transparent substrate 41. In one chip 82, a light receiving element 85 is formed in a region immediately below the fluorescent electrode portion 61 on the surface of a substrate 84 made of, for example, a silicon semiconductor. The light receiving element 85 is, for example, a photodiode and is made of a semiconductor with the PN junction. Further, an insulating layer 86 formed of, for example, the silicon oxide ($SiO_2$) is provided on the substrate 84. In the insulating layer 86, a through hole 86a is formed in a portion above the light receiving element 85. The chip 81 is laminated on the chip 82 such that the lower surface of the chip 81 is in contact with the upper surface of the insulating layer 86.

With the above configuration, for example, the light output from the fluorescent electrode portion 61 of the light emitting element 81a is modulated based on the signal generated by the circuit provided in the chip 81. Subsequently, the light from the fluorescent electrode portion 61 is received by the light receiving element 85 via the substrate 41 and the through hole 86a and is converted into an electrical signal, and the signal is sent to a circuit provided in the chip 82. In this way, the signal is transmitted from the chip 81 to the chip 82 as the optical signal.

Conventionally, the technology is known that a signal transmission between chips is performed by using a through-silicon-via (TSV) connected by a via wiring penetrating the silicon substrate, but in the above configuration, vias penetrating between the upper and lower sides of the chips and the wiring for filling the vias are not necessary, and the signals are transmitted and received by light, so that a high-speed communication between chips can be performed.

In addition, the fluorescent electrode portion 61 may be configured to be exposed in the through hole 86a. Further, the light emitting element may have the same configuration as the light emitting elements 60 and 65. Moreover, as the light receiving element, the light detection elements illustrated in the first to third embodiments can also be used.

Figure 17:
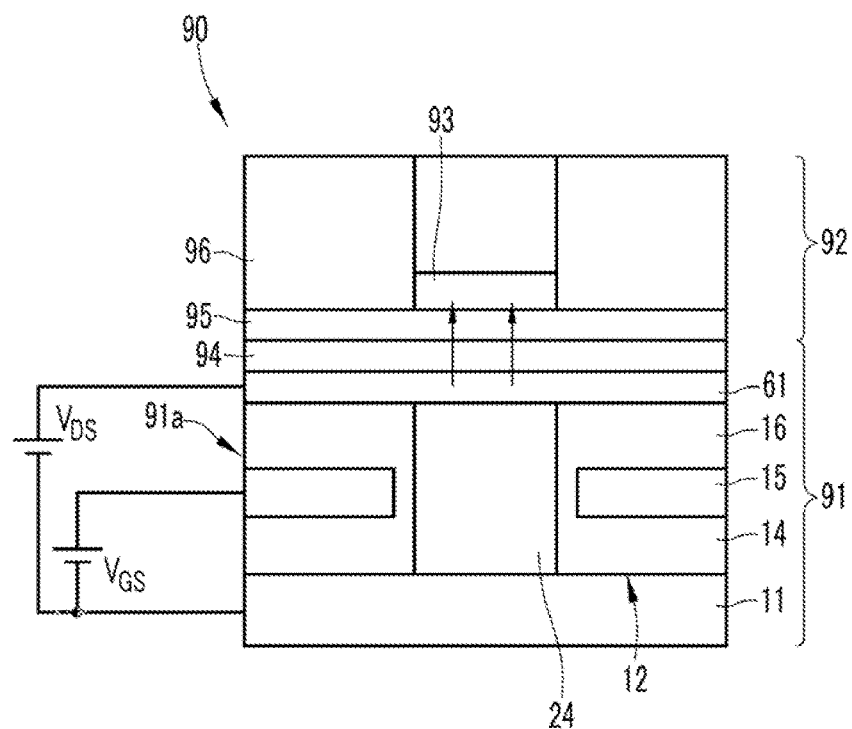
FIG. 17 is a cross-sectional view illustrating another example of the laminated chip.

In the above example, the light from a laminated upper chip is received by a lower chip, but the light from the lower chip may be received by an upper chip. A laminated chip 90 illustrated in FIG. 17 is obtained by laminating the chip 92 on the upper side of the chip 91, and has a configuration in which the light as a signal from a light emitting element 91a provided in the lower chip 91 is received by a light receiving element 93 provided in the upper chip 92. Additionally, in this example, the chip 91 is the first chip, and the chip 92 is the second chip.

The light emitting element 91a of the chip 91 includes, for example, the semiconductor layer 11 that is the silicon substrate, the laminated body 12 provided on the semiconductor layer 11, the fluorescent electrode portion 61 provided on the upper portion of the laminated body 12 and above the channel space 24, and a transparent insulating layer 94 layered on the fluorescent electrode portion 61. The insulating layer 94 is formed of, for example, the silicon oxide ($SiO_2$). The configuration of the light emitting element 91a is the same as that of the light emitting element 60 described above (see FIG. 12) except that the impurity diffusion layer is omitted and the insulating layer 94 is provided on the fluorescent electrode portion 61. Additionally, the backside electrode (not illustrated) for applying the gate-source voltage $V_{GS}$ is provided in the semiconductor layer 11. As in other examples, a conductive layer such as the impurity diffusion layer or a diffusion layer of the same type as the semiconductor layer 11 may be provided on the surface of the semiconductor layer 11.

In the chip 92, the light receiving element 93 is provided on a semiconductor layer 96 on a substrate 95 that is transparent and insulating, and is made of, for example, the silicon oxide ($SiO_2$). The light receiving element 93 is, for example, the photodiode with PN junction, and is provided immediately above the fluorescent electrode portion 61. The chip 92 is laminated on the chip 91 such that the lower surface of the chip 92 is in contact with the upper surface of the insulating layer 94 of the chip 91.

In the laminated chip 90, for example, the light output from the fluorescent electrode portion 61 of the light emitting element 91a is modulated based on the signal generated in a circuit provided in the chip 91, and the light is received by the light receiving element 93 through the insulating layer 94 and the substrate 95 and is converted into an electrical signal. In this way, the signal is transmitted from the chip 91 to the chip 92 as the optical signal.

In the above description, an example of the laminated chip in which one chip is laminated in two layers so as to be in contact with the other chip has been described, but the laminated chip is not limited thereto. For example, the laminated chip may be a chip in which chips are layered in three or more layers. Even in the case of three or more layers, by performing optical transmission by the above-described method between the layers in phase contact (between the chips), it is possible to transmit the signals by light when the signals are transmitted one after another between the layers, despite not being between the layers in phase contact. In this case, since the transmission is performed by light, it is possible to perform the signal transmission at a higher speed than a direct transmission between the layers not in phase contact by TSV technology accompanied with a stray capacitance and a wiring resistance.

What is claimed is:

1. A vacuum channel electronic element, comprising:
    a semiconductor layer;
    a laminated body wherein a first insulating layer that is insulating and formed on the semiconductor layer, a gate layer that is conductive and formed on the first insulating layer, a second insulating layer that is insulating and formed on the gate layer, and a drain layer that is conductive and formed on the second insulating layer are included, and wherein first side walls are exposed in a space defined by wall surfaces including the first side walls formed to include an end surface of the first insulating layer, an end surface, covered with an insulating film, of the gate layer, and an end surface of the second insulating layer; and
    a conductive layer that is conductive, formed of an n-type impurity diffusion layer formed in a partial region of a surface of p-type semiconductor, a p-type impurity diffusion layer formed in a partial region of a surface of an n-type semiconductor, a diffusion layer of a same type of conductivity as the semiconductor layer, or a metal layer formed in a partial region of a surface of a semiconductor in the semiconductor layer in the space, in contact with the first side walls in the space, has a lower resistivity than that of the semiconductor layer, and extending beyond the laminated body from the space through a non-forming region where the laminated body is not formed, wherein charge carriers in an induced inversion or accumulation layer of the semiconductor layer move into the conductive layer, the charge carriers are emitted into the space due to a Coulomb repulsive force between electrons, and the charge carriers travel to the drain layer in the space without flowing to the first side walls and the gate layer, by applying a predetermined voltage to the semiconductor layer, the conductive layer, the gate layer, and the drain layer;

wherein the laminated body comprises a gap and the conductive layer extends beyond the laminated body from the gap on the surface of the semiconductor layer.

2. The vacuum channel electronic element according to claim 1, wherein
the laminated body is provided in a circumferential shape with the gap formed in a part, the space is connected to an outside of the laminated body through the gap, and the first side walls are disposed along a periphery of the space.

3. The vacuum channel electronic element according to claim 1, wherein the drain layer is formed so as to cover an opening of the space.

4. A vacuum channel electronic element, comprising:
a semiconductor layer;
a first laminated body wherein the first insulating layer that is insulating and formed on the semiconductor layer, a gate layer that is conductive and formed on the first insulating layer, and a second insulating layer that is insulating and formed on the gate layer are included, and wherein first side wall is exposed in a space defined by wall surfaces including the first side wall formed to include an end surface of the first insulating layer, an end surface, covered with an insulating film, of the gate layer, and an end surface of the second insulating layer;
a second laminated body wherein a third insulating layer that is insulating and formed on the semiconductor layer and a drain layer that is conductive and formed on the third insulating layer are included, the wall surfaces include second side wall formed to include an end surface of the third insulating layer and an end surface of the drain layer, and the second side wall are exposed in the space; and
a conductive layer that is conductive, formed of an n-type impurity diffusion layer formed in a partial region of a surface of p-type semiconductor, a p-type impurity diffusion layer formed in a partial region of a surface of an n-type semiconductor, a diffusion layer of a same type of conductivity as the semiconductor layer, or a metal layer formed in a partial region of a surface of a semiconductor in the semiconductor layer in the space, in contact with the first side wall in the space, has a lower resistivity than that of the semiconductor layer, and extending from the space beyond the first laminated body via a region other than the first laminated body and the second laminated body,
wherein charge carriers in an induced inversion or accumulation layer of the semiconductor layer move into the conductive layer, the charge carriers are emitted into the space due to a Coulomb repulsive force between electrons, and the charge carriers travel to the drain layer in the space without flowing to the first side wall and the gate layer, by applying a predetermined voltage to the semiconductor layer, the conductive layer, the gate layer, and the drain layer;

wherein the conductive layer extends beyond the first laminated body and the second laminated body from the space on the surface of the semiconductor layer.

5. The vacuum channel electronic element according to claim 1, wherein the conductive layer is in contact with a part of the periphery of the first side wall.

6. A vacuum channel electronic element, comprising:
a base layer that is insulating;
a laminated body wherein a base insulating layer that is insulating and on the base layer, a semiconductor layer formed on the base insulating layer, a first insulating layer that is insulating and formed on the semiconductor layer, a gate layer that is conductive and formed on the first insulating layer, and a second insulating layer that is insulating and formed on the gate layer are included, and wherein first side walls formed to include an end surface of the base insulating layer, an end surface of the semiconductor layer, an end surface of the first insulating layer, and an end surface, covered with an insulating film, of the gate layer are exposed in a space; and
a drain layer that is conductive and provided on the base layer with a surface exposed to the space, wherein a position of the surface of the drain layer is separated from an interface between the semiconductor layer and the base insulating layer toward a side of the base layer,
wherein charge carriers in an induced inversion or accumulation layer of the semiconductor layer are emitted into the space due to a Coulomb repulsive force between electrons, and the charge carriers move to the drain layer in the space without flowing to the first side wall and the gate layer, by applying a predetermined voltage to the semiconductor layer, the gate layer and the drain layer;
wherein the laminated body comprises a gap and the drain layer extends beyond the laminated body from the space through the gap.

7. The vacuum channel electronic element according to claim 6, wherein
the laminated body is provided in a circumferential shape with the gap in a part, the space is connected to an outside of the laminated body through the gap, and the first side walls are disposed along a periphery of the space.

8. The vacuum channel electronic element according to claim 1, wherein the space is closed.

9. The vacuum channel electronic element according to claim 1, wherein the drain layer is a transparent fluorescent electrode portion that emits light by an incidence of charge carriers.

10. The vacuum channel electronic element according to claim 1, wherein
a light is made incident on an interface between the first insulating layer and the semiconductor layer,
a voltage is applied between the semiconductor layer and the gate layer such that a depletion layer is formed on the surface of the semiconductor layer, and
charge carriers caused by a light incident on the surface of the semiconductor layer move to the drain layer.

11. An optical transmission circuit, wherein
the vacuum channel electronic element according to claim 1, wherein the drain layer is a transparent fluorescent electrode portion that emits light by an incidence of charge carriers, provided as a light emitting element,
the vacuum channel electronic element according to claim 1, wherein a light is made incident on an interface between the first insulating layer and the semiconductor layer, a voltage is applied between the semiconductor layer and the gate layer such that a depletion layer is formed on the surface of the semiconductor layer, and charge carriers caused by a light incident on the surface of the semiconductor layer move to the drain layer, provided as a light receiving element, and a waveguide that guides the light from the light emitting element to the light receiving element are provided on the same substrate.

12. A laminated chip, wherein a first chip and a second chip are laminated, the first chip includes the vacuum channel electronic element according to claim 9 provided as a light emitting element, and outputs the light from the light emitting element in a laminating direction of the first chip and the second chip, and the second chip includes a light receiving element that receives the light from the light emitting element.

\* \* \* \* \*

UNITED STATES PATENT AND TRADEMARK OFFICE
CERTIFICATE OF CORRECTION

PATENT NO. : 12,062,650 B2
APPLICATION NO. : 18/051135
DATED : August 13, 2024
INVENTOR(S) : Yoshiyuki Ando It is certified that error appears in the above-identified patent and that said Letters Patent is hereby corrected as shown below:

On the Title Page

(73) Assignees: please delete "Reiko" and replace it with -- Rieko --.

Signed and Sealed this
Twelfth Day of November, 2024

Katherine Kelly Vidal
*Director of the United States Patent and Trademark Office*